(12) United States Patent
Parthasarathy et al.

(10) Patent No.: US 11,569,658 B2
(45) Date of Patent: Jan. 31, 2023

(54) HIGH VOLTAGE CLAMPS WITH TRANSIENT ACTIVATION AND ACTIVATION RELEASE CONTROL

(71) Applicant: Analog Devices, Inc., Norwood, MA (US)

(72) Inventors: Srivatsan Parthasarathy, Acton, MA (US); Javier Alejandro Salcedo, North Billerica, MA (US); James Zhao, San Francisco, CA (US)

(73) Assignee: Analog Devices, Inc., Norwood, MA (US)

( * ) Notice: Subject to any disclaimer, the term of this patent is extended or adjusted under 35 U.S.C. 154(b) by 92 days.

(21) Appl. No.: 16/946,917

(22) Filed: Jul. 10, 2020

(65) Prior Publication Data

US 2020/0343721 A1 Oct. 29, 2020

Related U.S. Application Data

(62) Division of application No. 15/215,938, filed on Jul. 21, 2016, now Pat. No. 10,734,806.

(51) Int. Cl.
*H02H 9/04* (2006.01)
*H01L 27/02* (2006.01)
*H02H 9/00* (2006.01)

(52) U.S. Cl.
CPC ......... *H02H 9/046* (2013.01); *H01L 27/0259* (2013.01); *H01L 27/0266* (2013.01);
(Continued)

(58) Field of Classification Search
CPC .......... H02H 9/046; H02H 9/04; H02H 9/041; H01L 27/0248–0296
See application file for complete search history.

(56) References Cited

U.S. PATENT DOCUMENTS

| 3,436,667 A | 4/1969 | Kedson |
| 4,331,884 A | 5/1982 | Svedberg |

(Continued)

FOREIGN PATENT DOCUMENTS

| CN | 1438704 A | 8/2003 |
| CN | 101273507 A | 9/2008 |

(Continued)

OTHER PUBLICATIONS

Office Action received in International Application No. 102017113889.7, dated Sep. 14, 2020, in 2 pages.
(Continued)

*Primary Examiner* — Jared Fureman
*Assistant Examiner* — Christopher J Clark
(74) *Attorney, Agent, or Firm* — Knobbe, Martens, Olson & Bear, LLP

(57) ABSTRACT

High voltage clamps with transient activation and activation release control are provided herein. In certain configurations, an integrated circuit (IC) includes a clamp electrically connected between a first node and a second node and having a control input. The IC further includes a first resistor-capacitor (RC) circuit that activates a detection signal in response to detecting a transient overstress event between the first node and the second node, an active feedback circuit that provides feedback from the first node to the control input of the clamp in response to activation of the detection signal, a second RC circuit that activates a shutdown signal after detecting passage of the transient overstress event based on low pass filtering a voltage difference between the first node and the second node, and a clamp shutdown circuit that turns off the clamp via the control input in response to activation of the shutdown signal.

20 Claims, 18 Drawing Sheets

(52) U.S. Cl.
CPC ......... *H01L 27/0285* (2013.01); *H02H 9/005* (2013.01); *H02H 9/041* (2013.01); *H02H 9/042* (2013.01)

(56) References Cited

U.S. PATENT DOCUMENTS

| | | | |
|---|---|---|---|
| 4,633,283 A | 12/1986 | Avery | |
| 5,061,652 A | 10/1991 | Bendernagel et al. | |
| 5,276,582 A | 1/1994 | Merrill et al. | |
| 5,341,005 A | 8/1994 | Canclini | |
| 5,343,053 A | 8/1994 | Avery | |
| 5,369,041 A | 11/1994 | Duvvury | |
| 5,400,202 A | 3/1995 | Metz et al. | |
| 5,436,786 A | 7/1995 | Pelly et al. | |
| 5,541,801 A | 7/1996 | Lee et al. | |
| 5,576,557 A | 11/1996 | Ker et al. | |
| 5,615,074 A | 3/1997 | Avery | |
| 5,652,689 A | 7/1997 | Yuan | |
| 5,663,860 A | 9/1997 | Swonger | |
| 5,682,047 A | 10/1997 | Consiglio et al. | |
| 5,719,733 A | 2/1998 | Wei et al. | |
| 5,742,084 A | 4/1998 | Yu | |
| 5,745,323 A | 4/1998 | English et al. | |
| 5,748,425 A | 5/1998 | Gutsch et al. | |
| 5,781,389 A | 7/1998 | Fukuzako et al. | |
| 5,786,617 A | 7/1998 | Merrill et al. | |
| 5,835,328 A | 11/1998 | Maloney et al. | |
| 5,852,540 A | 12/1998 | Haider | |
| 5,870,268 A | 2/1999 | Lin et al. | |
| 5,889,644 A | 3/1999 | Schoenfeld et al. | |
| 5,895,840 A | 4/1999 | Ohuchi et al. | |
| 5,895,940 A | 4/1999 | Kim | |
| 5,973,341 A | 10/1999 | Letavic et al. | |
| 5,978,192 A | 11/1999 | Young et al. | |
| 5,998,813 A | 12/1999 | Bernier | |
| 6,097,068 A | 8/2000 | Brown et al. | |
| 6,104,589 A | 8/2000 | Williamson | |
| 6,137,140 A | 10/2000 | Efland et al. | |
| 6,144,542 A | 11/2000 | Ker et al. | |
| 6,172,403 B1 | 1/2001 | Chen | |
| 6,236,087 B1 | 5/2001 | Daly et al. | |
| 6,258,634 B1 | 7/2001 | Wang et al. | |
| 6,310,379 B1 | 10/2001 | Andresen et al. | |
| 6,329,694 B1 | 12/2001 | Lee et al. | |
| 6,369,994 B1 | 4/2002 | Voldman | |
| 6,403,992 B1 | 6/2002 | Wei | |
| 6,404,261 B1 | 6/2002 | Grover et al. | |
| 6,423,987 B1 | 7/2002 | Constapel et al. | |
| 6,429,489 B1 | 8/2002 | Botula et al. | |
| 6,442,008 B1 | 8/2002 | Anderson | |
| 6,512,662 B1 | 1/2003 | Wang | |
| 6,538,266 B2 | 3/2003 | Lee et al. | |
| 6,590,273 B2 | 7/2003 | Okawa et al. | |
| 6,614,633 B1 | 9/2003 | Kohno | |
| 6,621,126 B2 | 9/2003 | Russ | |
| 6,665,160 B2 | 12/2003 | Lin et al. | |
| 6,667,870 B1 | 12/2003 | Segervall | |
| 6,704,180 B2 | 3/2004 | Tyler et al. | |
| 6,724,603 B2 | 4/2004 | Miller et al. | |
| 6,756,834 B1 | 6/2004 | Tong et al. | |
| 6,765,771 B2 | 7/2004 | Ker et al. | |
| 6,768,616 B2 | 7/2004 | Mergens et al. | |
| 6,784,489 B1 | 8/2004 | Menegoli | |
| 6,798,629 B1 | 9/2004 | Proebsting | |
| 6,828,842 B2 | 12/2004 | Saito et al. | |
| 6,861,680 B2 | 3/2005 | Ker et al. | |
| 6,870,202 B2 | 3/2005 | Oka | |
| 6,960,792 B1 | 11/2005 | Nguyen | |
| 6,960,811 B2 | 11/2005 | Wu et al. | |
| 6,979,869 B2 | 12/2005 | Chen et al. | |
| 7,034,363 B2 | 4/2006 | Chen | |
| 7,038,280 B2 | 5/2006 | Righter | |
| 7,064,393 B2 | 6/2006 | Mergens et al. | |
| 7,071,528 B2 | 7/2006 | Ker et al. | |
| 7,102,862 B1 | 9/2006 | Lien et al. | |
| 7,106,563 B2 | 9/2006 | Lai et al. | |
| 7,125,760 B1 | 10/2006 | Reese et al. | |
| 7,232,705 B2 | 6/2007 | Righter | |
| 7,232,711 B2 | 6/2007 | Gambino et al. | |
| 7,285,828 B2 | 10/2007 | Salcedo et al. | |
| 7,335,543 B2 | 2/2008 | Chen et al. | |
| 7,345,341 B2 | 3/2008 | Lin et al. | |
| 7,385,793 B1 | 6/2008 | Ansel et al. | |
| 7,436,640 B2 | 10/2008 | Su et al. | |
| 7,545,614 B2 | 6/2009 | Traynor et al. | |
| 7,566,914 B2 | 7/2009 | Salcedo et al. | |
| 7,570,467 B2 | 8/2009 | Watanabe et al. | |
| 7,601,991 B2 | 10/2009 | Salcedo et al. | |
| 7,663,190 B2 | 2/2010 | Vinson | |
| 7,706,113 B1 | 4/2010 | Lien et al. | |
| 7,714,357 B2 | 5/2010 | Hayashi et al. | |
| 7,738,222 B2 * | 6/2010 | Deutschmann | H01L 27/0262 361/111 |
| 7,834,378 B2 | 11/2010 | Ryu et al. | |
| 7,910,999 B2 | 3/2011 | Lee et al. | |
| 7,969,006 B2 | 6/2011 | Lin et al. | |
| 8,044,457 B2 | 10/2011 | Salcedo et al. | |
| 8,198,651 B2 | 6/2012 | Langguth et al. | |
| 8,217,461 B1 | 7/2012 | Chu et al. | |
| 8,218,276 B2 | 7/2012 | Mallikarjunaswamy | |
| 8,222,698 B2 | 7/2012 | Salcedo et al. | |
| 8,248,741 B2 | 8/2012 | Barrow | |
| 8,320,091 B2 | 11/2012 | Salcedo et al. | |
| 8,331,069 B2 | 12/2012 | Galy et al. | |
| 8,345,394 B2 | 1/2013 | Zhao et al. | |
| 8,368,116 B2 | 2/2013 | Salcedo et al. | |
| 8,416,543 B2 | 4/2013 | Salcedo | |
| 8,422,187 B2 | 4/2013 | Parthasarathy et al. | |
| 8,432,651 B2 | 4/2013 | Salcedo et al. | |
| 8,462,477 B2 | 6/2013 | Modica et al. | |
| 8,466,489 B2 | 6/2013 | Salcedo et al. | |
| 8,553,380 B2 | 10/2013 | Salcedo | |
| 8,564,065 B2 | 10/2013 | Donovan et al. | |
| 8,582,261 B2 | 11/2013 | Salcedo et al. | |
| 8,592,860 B2 | 11/2013 | Salcedo et al. | |
| 8,610,251 B1 | 12/2013 | Salcedo | |
| 8,633,509 B2 | 1/2014 | Salcedo et al. | |
| 8,637,899 B2 | 1/2014 | Salcedo | |
| 8,649,134 B2 | 2/2014 | Smith | |
| 8,665,570 B2 | 3/2014 | Jalilizeinali et al. | |
| 8,665,571 B2 | 3/2014 | Salcedo et al. | |
| 8,680,620 B2 | 3/2014 | Salcedo et al. | |
| 8,686,470 B2 | 4/2014 | Ritter | |
| 8,723,227 B2 | 5/2014 | Salcedo et al. | |
| 8,730,630 B2 | 5/2014 | Parthasarathy et al. | |
| 8,759,871 B2 | 6/2014 | Song et al. | |
| 8,772,091 B2 | 7/2014 | Salcedo et al. | |
| 8,773,826 B2 | 7/2014 | Althlaguirre et al. | |
| 8,796,729 B2 | 8/2014 | Clarke et al. | |
| 8,829,570 B2 | 9/2014 | Salcedo et al. | |
| 8,860,080 B2 | 10/2014 | Salcedo | |
| 8,890,248 B2 | 11/2014 | Pauletti et al. | |
| 8,946,822 B2 | 2/2015 | Salcedo et al. | |
| 8,947,841 B2 | 2/2015 | Salcedo et al. | |
| 8,958,187 B2 | 2/2015 | Parthasarathy et al. | |
| 8,963,200 B2 | 2/2015 | Lee et al. | |
| 9,006,781 B2 | 4/2015 | Salcedo et al. | |
| 9,013,845 B1 | 4/2015 | Karp | |
| 9,088,256 B2 | 7/2015 | Cosgrave et al. | |
| 9,123,540 B2 | 9/2015 | Salcedo et al. | |
| 9,147,677 B2 | 9/2015 | Salcedo et al. | |
| 9,171,832 B2 | 10/2015 | Salcedo et al. | |
| 9,184,098 B2 | 11/2015 | Salcedo et al. | |
| 9,275,991 B2 | 3/2016 | Salcedo et al. | |
| 9,293,912 B2 | 3/2016 | Parthasarathy et al. | |
| 9,368,485 B1 | 6/2016 | Chu | |
| 9,450,402 B1 | 9/2016 | Huang et al. | |
| 9,478,608 B2 | 10/2016 | Salcedo et al. | |
| 9,634,482 B2 | 4/2017 | Parthasarathy et al. | |
| 9,831,233 B2 | 11/2017 | Salcedo et al. | |
| 10,158,029 B2 | 12/2018 | Parthasarathy et al. | |
| 10,177,566 B2 | 1/2019 | Zhao et al. | |
| 10,199,369 B2 | 2/2019 | Parthasarathy et al. | |
| 10,249,609 B2 | 4/2019 | Salcedo et al. | |

(56) References Cited

U.S. PATENT DOCUMENTS

| | | |
|---|---|---|
| 10,734,806 B2 | 8/2020 | Zhao et al. |
| 2001/0040254 A1 | 11/2001 | Takiguchi |
| 2002/0021538 A1 | 2/2002 | Chen et al. |
| 2002/0081783 A1 | 6/2002 | Lee et al. |
| 2002/0109190 A1 | 8/2002 | Ker et al. |
| 2002/0122280 A1 | 9/2002 | Ker et al. |
| 2002/0153571 A1 | 10/2002 | Mergens et al. |
| 2002/0187601 A1 | 12/2002 | Lee et al. |
| 2003/0038298 A1 | 2/2003 | Cheng et al. |
| 2003/0043523 A1 | 3/2003 | Hung et al. |
| 2003/0076636 A1 | 4/2003 | Ker et al. |
| 2003/0201457 A1 | 10/2003 | Lin et al. |
| 2003/0214769 A1 | 11/2003 | Nishikawa et al. |
| 2004/0114288 A1 | 6/2004 | Cheng et al. |
| 2004/0135229 A1 | 7/2004 | Sasahara |
| 2004/0164351 A1 | 8/2004 | Petruzzello et al. |
| 2004/0164354 A1 | 8/2004 | Mergens et al. |
| 2004/0164356 A1 | 8/2004 | Josef Mergens et al. |
| 2004/0190208 A1 | 9/2004 | Levit |
| 2004/0207021 A1 | 10/2004 | Russ et al. |
| 2004/0240128 A1 | 12/2004 | Boselli et al. |
| 2005/0012155 A1 | 1/2005 | Ker et al. |
| 2005/0082618 A1 | 4/2005 | Wu et al. |
| 2005/0087807 A1 | 4/2005 | Righter |
| 2005/0088794 A1 | 4/2005 | Boerstler et al. |
| 2005/0093069 A1 | 5/2005 | Logie |
| 2005/0133869 A1 | 6/2005 | Ker et al. |
| 2005/0151160 A1 | 7/2005 | Salcedo et al. |
| 2005/0173727 A1 | 8/2005 | Manna et al. |
| 2005/0195540 A1 | 9/2005 | Streibl et al. |
| 2005/0269641 A1 | 12/2005 | Lai et al. |
| 2005/0286188 A1 | 12/2005 | Camp et al. |
| 2006/0033163 A1 | 2/2006 | Chen |
| 2006/0050452 A1 | 3/2006 | Oguzman et al. |
| 2006/0103998 A1 | 5/2006 | Smith |
| 2006/0109595 A1 | 5/2006 | Watanabe et al. |
| 2006/0145260 A1 | 7/2006 | Kim |
| 2006/0151836 A1 | 7/2006 | Salcedo et al. |
| 2006/0186467 A1 | 8/2006 | Pendharkar et al. |
| 2006/0285418 A1 | 12/2006 | Aoki |
| 2007/0007545 A1 | 1/2007 | Salcedo et al. |
| 2007/0058307 A1 | 3/2007 | Mergens et al. |
| 2007/0076338 A1 | 4/2007 | Traynor et al. |
| 2007/0158748 A1 | 7/2007 | Chu et al. |
| 2007/0195472 A1 | 8/2007 | Kwak et al. |
| 2007/0267701 A1 | 11/2007 | Sung et al. |
| 2008/0044955 A1 | 2/2008 | Salcedo et al. |
| 2008/0067601 A1 | 3/2008 | Chen |
| 2008/0106837 A1 | 5/2008 | Jang |
| 2008/0203534 A1 | 8/2008 | Xu et al. |
| 2008/0247102 A1 | 10/2008 | Vinson |
| 2008/0304191 A1 | 12/2008 | Riviere et al. |
| 2008/0316659 A1 | 12/2008 | Oguzman et al. |
| 2009/0032838 A1 | 2/2009 | Tseng et al. |
| 2009/0034137 A1 | 2/2009 | Disney et al. |
| 2009/0045457 A1 | 2/2009 | Bobde |
| 2009/0057715 A1 | 3/2009 | Ryu et al. |
| 2009/0122452 A1 | 5/2009 | Okushima |
| 2009/0140802 A1 | 6/2009 | Kitagawa et al. |
| 2009/0206376 A1 | 8/2009 | Mita et al. |
| 2009/0230426 A1 | 9/2009 | Carpenter et al. |
| 2009/0236631 A1 | 9/2009 | Chen et al. |
| 2009/0309128 A1 | 12/2009 | Salcedo et al. |
| 2010/0133583 A1 | 6/2010 | Mawatari et al. |
| 2010/0148797 A1 | 6/2010 | Ker et al. |
| 2010/0149701 A1* | 6/2010 | Drapkin ............. H01L 27/0285 |
| | | 716/115 |
| 2010/0163973 A1 | 7/2010 | Nakamura et al. |
| 2010/0214704 A1 | 8/2010 | Lamey et al. |
| 2010/0214706 A1 | 8/2010 | Crespo et al. |
| 2010/0321841 A1* | 12/2010 | Worley ............... H02H 9/046 |
| | | 361/56 |
| 2010/0327343 A1 | 12/2010 | Salcedo et al. |
| 2010/0328827 A1 | 12/2010 | Lai et al. |
| 2011/0101444 A1 | 5/2011 | Coyne et al. |
| 2011/0110004 A1 | 5/2011 | Maier |
| 2011/0176244 A1 | 7/2011 | Gendron et al. |
| 2011/0198678 A1 | 8/2011 | Ker et al. |
| 2011/0207409 A1 | 8/2011 | Ker et al. |
| 2011/0222196 A1 | 9/2011 | Smith |
| 2011/0235228 A1 | 9/2011 | Salcedo et al. |
| 2011/0284922 A1 | 11/2011 | Salcedo et al. |
| 2011/0303947 A1 | 12/2011 | Salcedo et al. |
| 2011/0304944 A1 | 12/2011 | Salcedo et al. |
| 2012/0002333 A1 | 1/2012 | Soldner et al. |
| 2012/0002337 A1 | 1/2012 | Parthasarathy et al. |
| 2012/0007207 A1 | 1/2012 | Salcedo |
| 2012/0008242 A1 | 1/2012 | Salcedo |
| 2012/0057260 A1 | 3/2012 | Poulton |
| 2012/0176708 A1 | 7/2012 | Tsai |
| 2012/0180008 A1 | 7/2012 | Gist et al. |
| 2012/0199874 A1 | 8/2012 | Salcedo et al. |
| 2012/0205714 A1 | 8/2012 | Salcedo et al. |
| 2012/0211869 A1 | 8/2012 | Lee et al. |
| 2012/0257317 A1 | 10/2012 | Abou-Khalil et al. |
| 2012/0293904 A1 | 11/2012 | Salcedo et al. |
| 2012/0320483 A1 | 12/2012 | Salcedo et al. |
| 2013/0032882 A1 | 2/2013 | Salcedo et al. |
| 2013/0155558 A1 | 6/2013 | Bourgeat et al. |
| 2013/0208385 A1 | 8/2013 | Salcedo et al. |
| 2013/0234209 A1 | 9/2013 | Parthasarathy et al. |
| 2013/0242448 A1 | 9/2013 | Salcedo et al. |
| 2013/0270605 A1 | 10/2013 | Salcedo et al. |
| 2013/0330884 A1 | 12/2013 | Salcedo et al. |
| 2014/0078624 A1 | 3/2014 | Nagamatsu et al. |
| 2014/0133055 A1 | 5/2014 | Parthasarathy et al. |
| 2014/0138735 A1 | 5/2014 | Clarke et al. |
| 2014/0167104 A1 | 6/2014 | Salcedo |
| 2014/0167105 A1 | 6/2014 | Salcedo et al. |
| 2014/0167106 A1 | 6/2014 | Salcedo |
| 2014/0168831 A1* | 6/2014 | Watanabe ............ H02H 9/046 |
| | | 361/56 |
| 2014/0185168 A1 | 7/2014 | Kunz, Jr. et al. |
| 2014/0285932 A1* | 9/2014 | Miyamoto ............ H02H 9/005 |
| | | 361/56 |
| 2014/0339601 A1 | 11/2014 | Salcedo et al. |
| 2014/0346563 A1 | 11/2014 | Salcedo et al. |
| 2014/0355157 A1 | 12/2014 | Huang et al. |
| 2015/0076557 A1 | 3/2015 | Salcedo et al. |
| 2015/0229125 A1* | 8/2015 | Kato ..................... H02H 9/046 |
| | | 361/56 |
| 2015/0263505 A1 | 9/2015 | Takada |
| 2015/0270258 A1 | 9/2015 | Dabral et al. |
| 2015/0276854 A1 | 10/2015 | Cejka et al. |
| 2015/0311700 A1 | 10/2015 | Lee |
| 2016/0020603 A1 | 1/2016 | Parthasarathy et al. |
| 2016/0087429 A1 | 3/2016 | Wang et al. |
| 2016/0140075 A1 | 5/2016 | Kashyap et al. |
| 2016/0204096 A1 | 7/2016 | Zhao et al. |
| 2016/0261110 A1 | 9/2016 | Ivanov et al. |
| 2016/0285255 A1 | 9/2016 | O'Donnell et al. |
| 2016/0300830 A1 | 10/2016 | Salcedo et al. |
| 2016/0336740 A1 | 11/2016 | Parthasarathy et al. |
| 2016/0336744 A1 | 11/2016 | Parthasarathy et al. |
| 2017/0243862 A1 | 8/2017 | Parthasarathy et al. |
| 2017/0256534 A1 | 9/2017 | Parthasarathy et al. |
| 2017/0317070 A1 | 11/2017 | Salcedo et al. |
| 2018/0006448 A1 | 1/2018 | Glaser et al. |
| 2018/0158814 A1 | 6/2018 | Salcedo et al. |
| 2018/0159323 A1 | 6/2018 | Huang et al. |
| 2018/0211951 A1 | 7/2018 | Luo et al. |
| 2018/0226788 A1 | 8/2018 | Salcedo et al. |
| 2018/0287378 A1 | 10/2018 | Sithanandam |
| 2019/0131787 A1 | 5/2019 | He et al. |
| 2020/0227914 A1 | 7/2020 | Salcedo et al. |

FOREIGN PATENT DOCUMENTS

| | | |
|---|---|---|
| CN | 101297451 A | 10/2008 |
| CN | 101626154 A | 1/2010 |
| CN | 101707368 A | 5/2010 |
| CN | 201536104 U | 7/2010 |
| CN | 102118024 A | 7/2011 |
| CN | 103219720 A | 7/2013 |

(56) References Cited

FOREIGN PATENT DOCUMENTS

| CN | 103248033 A | 8/2013 |
| --- | --- | --- |
| CN | 103401229 A | 11/2013 |
| CN | 103795026 A | 5/2014 |
| CN | 203607843 U | 5/2014 |
| CN | 103839941 | 6/2014 |
| CN | 103915828 A | 7/2014 |
| CN | 104283201 A | 1/2015 |
| CN | 104753055 | 7/2015 |
| EP | 1617477 A1 | 1/2006 |
| EP | 1048078 B1 | 5/2010 |
| TW | 577166 B | 2/2004 |
| WO | WO 03/063203 A2 | 7/2003 |
| WO | WO 2009/050641 | 4/2009 |
| WO | WO 2012/003114 A1 | 1/2012 |
| WO | WO 2014/180184 A1 | 11/2014 |
| WO | WO 2017/078676 A1 | 5/2017 |

OTHER PUBLICATIONS

Chang et al., "High-k Metal Gate-bounded Silicon Controlled Rectifier for ESD Protection" Electrical Overstress / Electrostatic Discharge Symposium Proceedings 2012, in 7 pages.

German Office Action for Application No. 102017113889.7 dated Feb. 26, 2018, in 7 pages.

Invitation to Pay Additional Fees Notice for International Application No. PCT/EP2020/050205 dated Mar. 16, 2020, in 136 pages.

Ker et al., "ESD protection design for CMOS RF integrated circuits using polysilicon diodes" Microelectronics Reliability 42(6):863-872, Jun. 2002, in 10 pages.

Ker et al., "SCR Device With Double-Triggered Technique for On-Chip ESD Protection in Sub-Quarter-Micron Silicided CMOS Processes" IEEE Transactions on Device and Materials Reliability, vol. 3, Issue 3, Sep. 2003, in 11 pages.

Notice of Allowance received in CN Application 201710587986.0, dated Jan. 2, 2020, in 2 pages.

Office Action received in CN Application No. 201710587986.0, dated Jul. 23, 2019, in 8 pages.

Office Action received in CN Application No. 201711271836.5, dated Jan. 22, 2019, in 7 pages.

Salcedo et al., Electrostatic Discharge Protection Framework for Mixed-Signal High Voltage CMOS Applications. 9th International Conference on Solid-State and Integrated-Circuit Technology, Oct. 2008. 4 pages.

Salcedo et al., Monolithic ESD Protection for Distributed High Speed Applications in 28-nm CMOS Technology, IEEE 2014, 4 pages.

Zhang et al., "A Full-Chip ESD Protection Circuit Simulation and Fast Dynamic Checking Method Using SPICE and ESD Behavior Models" IEEE Transactions on Computer-Aided Design of Integrated Circuits and Systems, vol. 38, Issue 3, Mar. 2019 in 10 pages.

* cited by examiner

HIGH VOLTAGE CLAMPS WITH TRANSIENT ACTIVATION AND ACTIVATION RELEASE CONTROL

REFERENCE TO RELATED APPLICATIONS

This application is a divisional application of U.S. patent application Ser. No. 15/215,938, titled "HIGH VOLTAGE CLAMPS WITH TRANSIENT ACTIVATION AND ACTIVATION RELEASE CONTROL" and filed on Jul. 21, 2016, the entire disclosure of which is hereby incorporated by reference for all purposes for all that it contains.

FIELD OF THE DISCLOSURE

Embodiments of the invention relate to electronic systems, and more particularly to, circuit architectures for scalable high voltage overstress clamping including activation and activation release control.

BACKGROUND

Certain electronic systems can be exposed to transient overstress events, or electrical signals of short duration having rapidly changing voltage and high power. Transient overstress events can include, for example, electrical overstress (EOS) events and/or electrostatic discharge (ESD) events arising from the abrupt release of charge from an object or person to an electronic system.

Transient overstress events can damage or destroy integrated circuits (ICs) by generating overvoltage conditions and high levels of power dissipation in relatively small areas of the ICs. High power dissipation can increase IC temperature, and can lead to numerous problems, such as gate oxide punch-through, junction damage, metal damage, and surface charge accumulation.

SUMMARY OF THE DISCLOSURE

High voltage clamps with active activation and activation-release control are provided herein. In certain configurations, a clamp can have scalable operating clamping voltage level and can be used to protect the electrical circuit connected to a power supply of a semiconductor chip from damage from an overstress event, such as electrostatic discharge (ESD) events. The pins of the power supply are actively monitored to detect when an overstress event is present, and the clamp is turned-on in response to detecting the overstress event. A timer is used to shut down the clamp after a time delay from detecting the overstress event, thereby providing a false detection shutdown mechanism that prevents the protection clamp from getting falsely activated and remain in the on-state during normal circuit operation.

In one aspect, an integrated circuit includes a clamp electrically connected between a first node and a second node, and an isolation circuit configured to generate an isolated voltage based on a voltage of the first node, and an active clamp control circuit. The clamp is selectively activated by a clamp activation signal. Additionally, the active clamp control circuit includes a trigger circuit configured to detect presence of a transient overstress event at the first node based on the isolated voltage, and the trigger circuit activates a regulated voltage in response to detecting presence of the transient overstress event. The active clamp control circuit further includes a logic circuit configured to control activation and release of the clamp by controlling the clamp activation signal, and the logic circuit is configured to receive power from the regulated voltage.

In another aspect, an active clamp control circuit for controlling a power supply clamp is provided. The active clamp control circuit includes a trigger circuit configured to detect presence of a transient overstress event between a pair of nodes of a power supply. The trigger circuit includes a regulator configured to activate a regulated voltage in response to detecting presence of the transient overstress event, and a timer configured to activate a trigger signal after a time delay from activation of the regulated voltage. The active clamp control circuit further includes a logic circuit powered by the regulated voltage, and the logic circuit is configured to turn on the clamp in response to activation of the regulated voltage, and to turn off the clamp in response to activation of the trigger signal.

In another aspect, a method of providing actively-controlling overstress protection is provided. The method includes activating a regulated voltage in response to detecting presence of a transient overstress event between a pair of nodes of a power supply, powering a logic circuit using the regulated voltage, turning on a clamp that is electrically connected between the pair of nodes using the logic circuit in response to activation of the regulated voltage, activating a trigger signal after a time delay from activation of the regulated voltage using a timer, and turning off the clamp using the logic circuit in response to activation of the trigger signal.

In another aspect, an integrated circuit is provided. The integrated circuit includes a clamp electrically connected between a first node and a second node, and the clamp includes a control input for controlling activation of the clamp. The integrated circuit further includes a first resistor-capacitor (RC) circuit configured to activate a detection signal in response to detecting a transient overstress event between the first node and the second node, an active feedback circuit configured to provide feedback from the first node to the control input of the clamp in response to activation of the detection signal, a second RC circuit configured to activate a shutdown signal after detecting passage of the transient overstress event based on low pass filtering a voltage difference between the first node and the second node, and a clamp shutdown circuit configured to turn off the clamp via the control input in response to activation of the shutdown signal.

DETAILED DESCRIPTION

Figure 1:
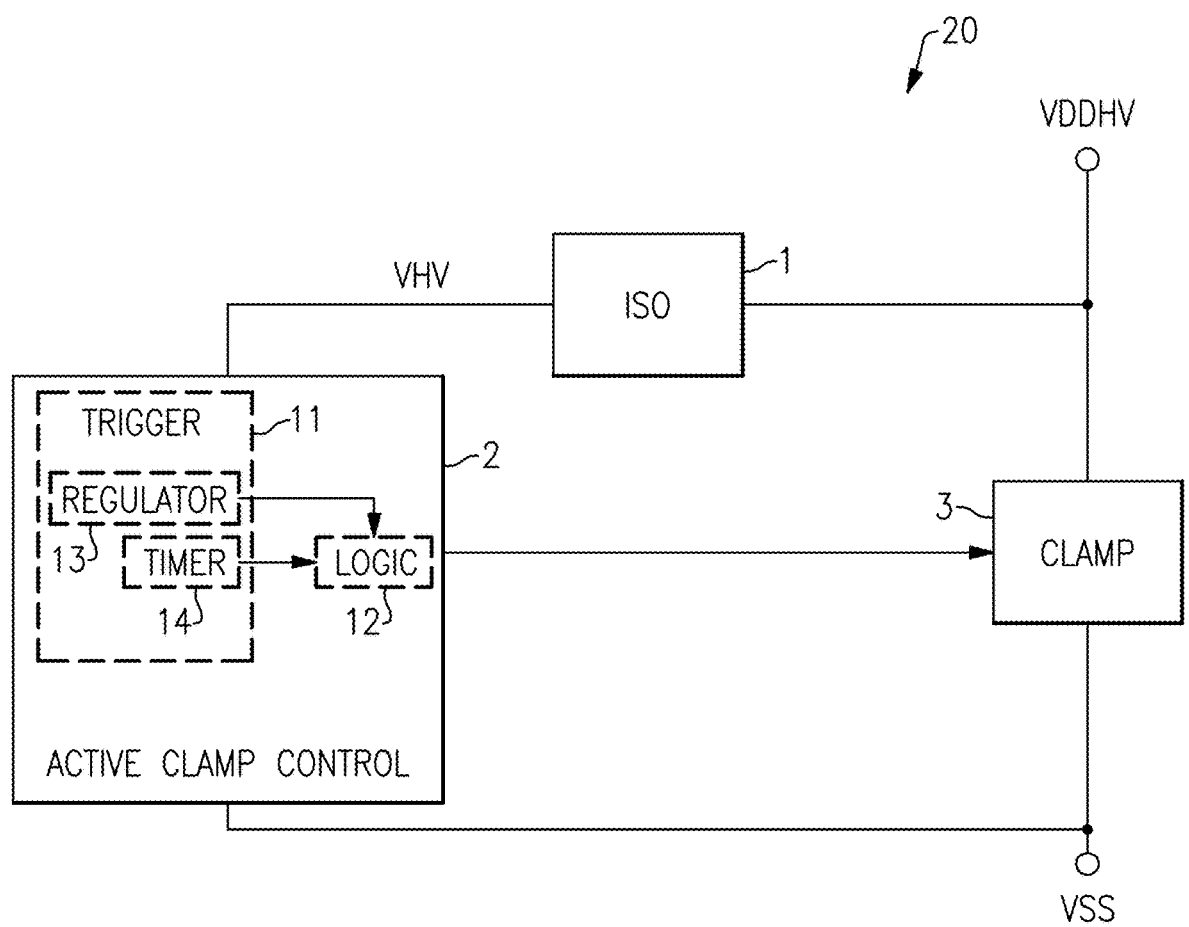
FIG. 1 is a schematic diagram of an actively-controlled high voltage clamp according to one embodiment.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Certain electronic systems include overstress protection circuits to protect circuits or components from transient overstress events. To help guarantee that an electronic system is reliable, manufacturers can test the electronic system under defined stress conditions, which can be described by standards set by various organizations, such as the Joint Electronic Device Engineering Council (JEDEC), the International Electrotechnical Commission (IEC), and the Automotive Engineering Council (AEC). The standards can cover a wide multitude of transient overstress events, including electrical overstress (EOS) and/or electrostatic discharge (ESD) events.

An actively-controlled protection circuit is a type of overstress protection circuit that detects for the presence of a transient overstress event by monitoring for electrical conditions associated with overstress. By implementing a protection circuit with active control, relatively fast activation times, relatively low static power dissipation, and/or relatively compact area can be achieved relative to an implementation that relies on native junction breakdown to provide clamping.

In certain implementations herein, an actively-controlled high voltage clamp includes an isolation circuit, an active clamp control circuit, and a clamp that is electrically connected between a power supply node and a ground node. The isolation circuit controls a voltage of an isolated high voltage node based on a voltage of the power supply node. The active clamp control circuit detects whether or not a transient overstress event is present based on a voltage difference between the isolated high voltage node and the ground node. When the active clamp control circuit detects the presence of the transient overstress event, the active clamp control circuit turns on the clamp to provide low impedance between the power supply node and the ground node.

In certain configurations, the active clamp control circuit includes a logic circuit that turns on or off the clamp and a trigger circuit that includes a regulator and a timer. The regulator generates a regulated voltage used to power the logic circuit, and the timer generates a trigger signal that serves as an input to the logic circuit. In response to a transient overstress event, the regulator turns on the regulated voltage, and the logic circuit activates the clamp to provide overstress protection. After a time delay of the timer, the trigger signal is activated and the logic circuit turns off the clamp.

Accordingly, the active clamp control circuit turns on the clamp in response to detecting a transient overstress event, and turns off the clamp after a time delay controlled by the timer. Implementing the active clamp control circuit in this manner provides fast turn-on time and low voltage overshoot, while providing a false detection shutdown mechanism that enhances robustness to false triggering.

In certain configurations, the clamp includes a high voltage metal oxide semiconductor (MOS) transistor, such as a double-diffused metal oxide semiconductor (DMOS) transistor. In such an implementation, the active clamp control circuit can turn on or off the clamp by controlling the high voltage MOS transistor's gate voltage. In certain configurations, the clamp includes a cascade of two or more devices, such as high voltage MOS transistors, thereby enhancing the clamp's high voltage handling capability.

The actively-controlled high voltage clamp can provide protection between a pair of nodes that operate with high voltage during normal operating conditions of an integrated circuit (IC) or semiconductor chip. In one example, an actively-controlled high voltage clamp provides protection for a pair of nodes that operate with a high voltage in the range of 8 V to up to a native breakdown voltage of the clamp, for instance, about 60 V for a clamp implemented with a DMOS transistor in a 0.18 μm BCD process. In another example, a drain extended metal oxide semiconductor (DEMOS) technology is used, and protection is provided between a pair of nodes that operate with a nominal voltage difference of up to about 5 V. In another example, a higher voltage DMOS process is used, such as those used for automotive and industrial applications, and protection is provided between a pair of nodes that operate with a nominal voltage difference of up to about 200 V.

In response to a transient overstress event, the actively-controlled high voltage clamp can operate with relatively fast turn-on time, for instance, turn-on of about 2 ns or less. The actively-controlled high voltage clamp can be suitable for protecting sensitive high voltage junctions, which can be a major design challenge in emerging high voltage and mixed-signal applications.

In certain configurations, the actively-controlled high voltage clamp is implemented with an overvoltage detector used to retrigger or reset the active clamp control circuit. The overvoltage detector retriggers the active clamp control circuit and resets the timer when an overvoltage condition is detected. When the active clamp control circuit is falsely triggered, such as during a power supply ramp-up associated with IC turn-on, the overvoltage detector does not retrigger the active clamp control circuit, and the clamp shuts off after the time delay of the timer. However, when a transient overstress event is present, the overvoltage detector can reset the active clamp control circuit one or more times until the overstress event is sufficiently discharged, thereby allowing the clamp to be maintained turned on for substantially the full duration of the transient overstress event. By including a false detection shutdown mechanism, fault detection and clamp shunt-down can be provided during powered-conditions, while providing a retrigger or reset mechanism to provide robust clamping.

The actively-controlled high voltage clamps described herein can provide high voltage clamping in high voltage process technologies, and can limit a maximum amount of overstress to be below a voltage that causes damage. In certain implementations, when an overstress event occurs between a pair of pins on an unpowered or powered IC, the actively-controlled high voltage clamp can limit the maximum overvoltage during the overstress to be less than a nominal operating voltage between the pair of pins.

Thus, the actively-controlled high voltage clamp can provide robust overstress protection with relatively fast turn-on time, relatively low voltage overshoot, relatively low standing leakage current, stability over temperature, and a false triggering shutdown mechanism.

In contrast, a protection clamp that operates using native or direct junction breakdown may have insufficient voltage margin between a nominal operating voltage and the breakdown voltage of junctions, and thus may not turn on sufficiently quickly to provide overstress protection. In another example, a resistor-capacitor trigger network can be used to turn on a gate of DMOS clamp relatively quickly. However, a DMOS clamp having a gate activated by a resistor-capacitor trigger network may by falsely triggered during normal IC operation and may be unable to shut down.

FIG. 1 is a schematic diagram of an actively-controlled high voltage clamp 20 according to one embodiment. The actively-controlled high voltage clamp 20 includes an isolation circuit 1, an active clamp control circuit 2, and a clamp 3.

In the illustrated embodiment, the actively-controlled high voltage clamp 20 is electrically connected between a power supply node VDDHV and a ground node VSS. Thus, the actively-controlled high voltage clamp 20 operates as a power supply clamp in this embodiment.

Although illustrated in the context of providing overstress protection between a power supply voltage node and a ground node, the actively-controlled high voltage clamps herein can be used to provide overstress protection in a wide variety of ways. For example, the clamp 3 can be electrically connected between a first node and a second node, which can correspond to, for example, pins, pads, bumps, voltage planes, and/or other structures, or a combination thereof. In certain implementations, the first node and the second node are biased with a high voltage power supply and ground, respectively, but other configurations are possible. Thus, although the illustrated embodiment is shown with the first node corresponding to the power supply node VDDHV and the second node corresponding to the ground node VSS, the teachings herein are applicable to other configurations.

One or more instantiations of the actively-controlled high voltage clamp 20 can be included on an IC or chip. The actively-controlled high voltage clamp 20 can provide protection to circuitry integrated on the same IC and/or to circuitry on a separate IC. For example, the teachings herein are applicable to systems using die-to-die wire-bond, flip-chip bump connectivity, pillar flip-chip connection, and/or through-substrate via (TSV) connectivity.

As shown in FIG. 1, the clamp 3 is electrically connected between the power supply node VDDHV and the ground node VSS, and is selectively activated by a clamp activation signal from the active clamp control circuit 2. The clamp 3 can be implemented in a wide variety of ways, and can include, for example, one or more high voltage MOS transistors, such as DMOS transistors (including, but not limited to lateral DMOS transistors and drain-extended DMOS transistors).

The isolation circuit 1 allows energy flow from the power supply node VDDHV to the isolated high voltage node VHV, while restricting energy flow from the isolated high voltage node VHV to the power supply node VDDHV. Including the isolation circuit 1 allows the isolated high voltage node VHV to be energized by the power supply node VDDHV when the voltage of the power supply node VDDHV is greater than the voltage of the isolated high voltage node VHV, while inhibiting the isolated high voltage node VHV from losing energy to the power supply node VDDHV when the voltage of the power supply node VDDHV is smaller than the voltage of the isolated high voltage node VHV. For example, when the clamp 3 is activated after the active clamp control circuit 2 detects a transient overstress event, turn-on of the clamp 3 can pull-down the voltage of the power supply node VDDHV relatively quickly.

Accordingly, including the isolation circuit 1 inhibits the voltage of the isolated high voltage node VHV from being pulled or dragged down when the voltage of the power supply node VDDHV is in rapid decline after activation of the clamp 3. Thus, the isolation circuit 1 inhibits voltage decline or decrease of the isolated high voltage node VHV after turn-on of the clamp 3, thereby providing a relatively stable and continuous voltage on the isolated high voltage node VHV. Accordingly, the active clamp control circuit 2 can operate in a well-defined state and provide robust control over activation and deactivation of the clamp 3 even when the voltage of the power supply node VDDHV is in very rapid decline.

The active clamp control circuit 2 detects whether or not a transient overstress event is present based on a voltage difference between the isolated high voltage node VHV and the ground node VSS. When a transient overstress event is present, the active clamp control circuit 2 turns on the clamp 3 via the clamp activation signal, thereby operating the clamp 3 in an ON or low impedance state. However, when the active clamp control circuit 2 does not detect a transient overstress event, the active clamp control circuit 2 operates the clamp 3 in an OFF or high impedance state. In one embodiment, the OFF state impedance can be, for example, in the range of about 0.1 GΩ to 10 GΩ, and the ON state impedance can be, for example, in the range of about 0.3Ω to 5Ω.

As shown in FIG. 1, the illustrated active clamp control circuit 2 includes a trigger circuit 11 and a logic circuit 12. The logic circuit 12 controls the clamp activation signal for turning on or off the clamp 3. Additionally, trigger circuit 11 includes a regulator 13 that generates a regulated voltage for powering the logic circuit 12, and a timer 14 that generates a trigger signal that serves as an input to the logic circuit 12. In response to the active clamp control circuit 2 detecting a transient overstress event, the regulator 13 outputs the regulated voltage, thereby powering the logic circuit 12, which in turn activates the clamp 3 to provide low impedance between the power supply node VDDHV and the ground node VSS. After a time delay of the timer 14, the trigger signal is activated and the logic circuit 12 turns off the clamp via the clamp activation signal.

Accordingly, the active clamp control circuit 2 turns on the clamp 3 in response to detecting a transient overstress event, and turns off the clamp 3 after a time delay controlled by the timer 14. Implementing the active clamp control circuit 2 in this manner provides fast turn-on time, low voltage overshoot, and a reliable triggering and shutdown mechanism.

The active clamp control circuit 2 determines whether or not an overstress event is present at the power supply node VDDHV, and generates the regulated voltage for powering the logic circuit 12 when the transient overstress event is detected. The regulated voltage is generated from the isolated high voltage received on the isolated high voltage node VHV.

By including the voltage regulator 13, the active clamp control circuit 2 can activate in response to an overstress event even when the power supply node VDDHV and the ground node VSS are unpowered (for example, when a IC is turned off and/or being handled). For example, during an overstress event, the voltage of the power supply node VDDHV increases relative to a voltage of the ground node VSS, and the isolation circuit 1 forces the voltage of the isolated high voltage node VHV to follow the voltage of the power supply node VDDHV. When the voltage of the isolated high voltage node VHV is sufficiently high, the voltage regulator 13 can turn-on to generate a regulated voltage that is used to power the logic circuit 12. Thus, protection from overstress events can be provided for both powered and unpowered chips and circuits.

In certain configurations, in response to detection of a transient overstress event, the regulator 13 generates the regulated voltage relatively quickly, for instance, in less than about 2 ns. Additionally, the logic circuit 12 is implemented to turn on the clamp 3 in response to receiving power via the regulated voltage. After a time delay of the timer 14, the trigger signal is deactivated, and thereafter the logic circuit 12 turns off the clamp 3. The timer 14 can be implemented in a variety of ways. In one example, the time delay of the timer 14 is determined using a resistor-capacitor network. For example, a resistor-capacitor network can be electrically connected between the regulated voltage and the ground node VSS, thereby providing a time delay from activation of the regulated voltage that is based on a time constant of the resistor-capacitor network. However, other implementations of a timer are possible.

Figure 2:
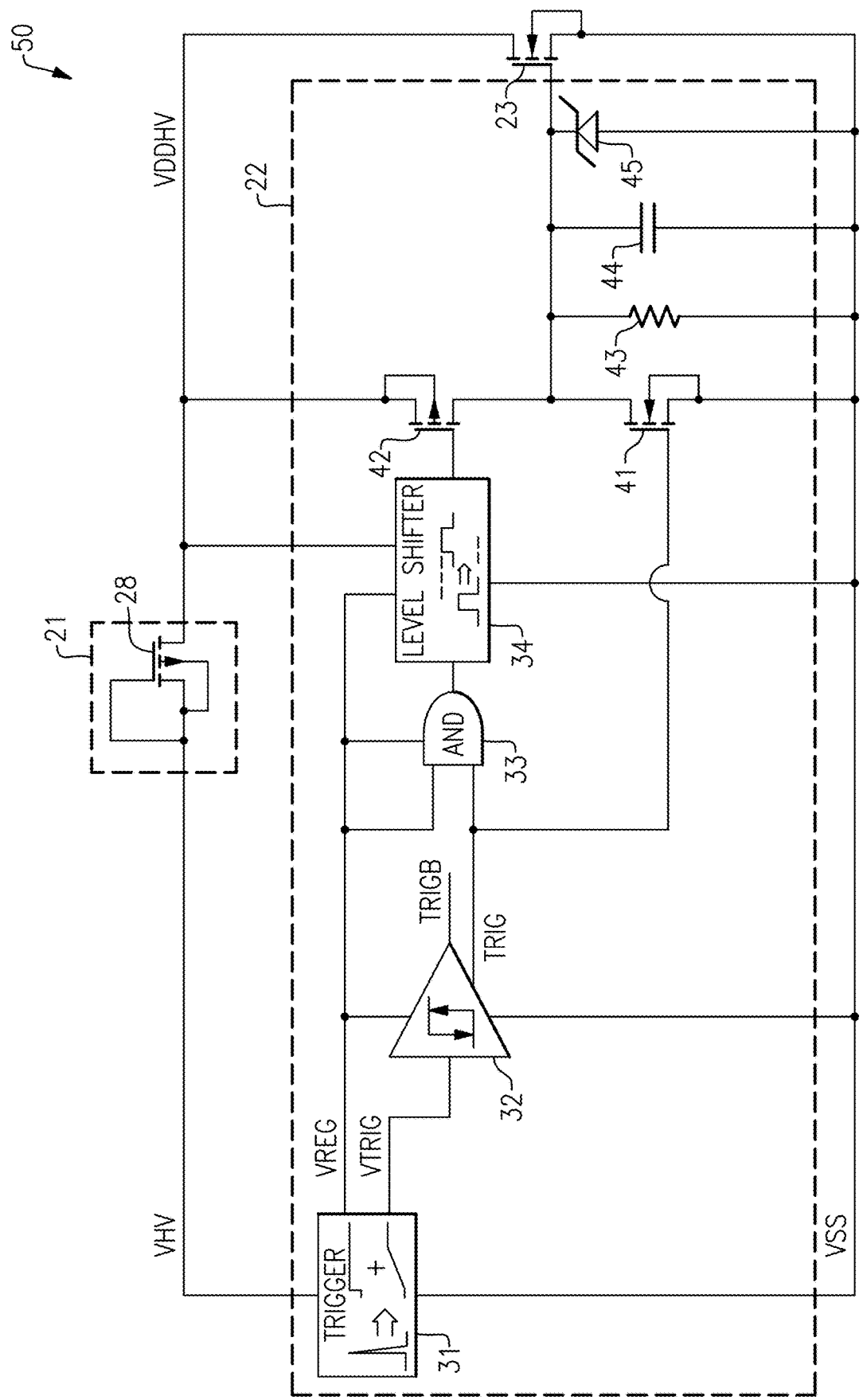
FIG. 2 is a schematic diagram of an actively-controlled high voltage clamp according to another embodiment.

FIG. 2 is a schematic diagram of an actively-controlled high voltage clamp 50 according to one embodiment. The actively-controlled high voltage clamp 50 includes an isolation circuit 21, an active clamp control circuit 22, and a clamp transistor 23.

The clamp transistor 23 is implemented as an NMOS device in this example, and includes a drain electrically connected to the power supply node VDDHV, a source electrically connected to the ground node VSS, a body electrically connected to the source, and a gate that receives a clamp activation signal generated by the active clamp control circuit 22. In certain implementations, the clamp transistor 23 is implemented using a high voltage MOS transistor, such as a DMOS transistor.

Although one example of a clamp is shown in FIG. 2, the teachings herein are applicable to other configurations of clamps, including, for example, clamps implemented using other types of components and/or using additional components of the same and/or different type. In one example, the clamp transistor 23 is implemented with a PMOS transistor (including, for instance, a PDMOS device), and the active clamp control circuit's logic circuitry is modified to provide a clamp control signal of proper polarity to the gate of the PMOS transistor.

The isolation circuit 21 includes a drain electrically connected to the power supply node VDDHV, a source electrically connected to an isolated high voltage node VHV, a gate electrically connected to the source, and a body electrically connected to the source. In certain implementations, the isolation transistor 21 is implemented using a high voltage MOS transistor, such as a DMOS transistor.

In the illustrated embodiment, the isolation circuit 21 includes a diode-connected PMOS transistor, which allows for fast channel conduction during forward-diode operation while blocking conduction in reverse-diode operation. However, an isolation circuit can be implemented in a wide variety of ways, including, but not limited to, using other semiconductor devices, including, but not limited to, devices operated in standard diode mode. Thus, the teachings herein are applicable to other configurations of isolation circuits, including, for example, isolation circuits implemented using diode-connected PMOS or other types of components and/or additional components of the same and/or different type.

Including the isolation circuit 21 aids the active clamp control circuit 22 in detecting presence of a transient overstress event while enhancing the robustness of the actively-controlled high voltage clamp 50 from unintended activation and/or damage during overstress. For example, the isolation circuit 21 can provide low-pass filtering to the voltage of the power supply node VDDHV, thereby preventing high frequency glitches associated with power-up and/or IC activity from falsely triggering the active clamp control circuit 22. Additionally, the isolation circuit 21 can provide protection to circuitry of the active clamp control circuit 22 from damage during an overstress event by isolating the active clamp control circuit 22 from peak voltage overshoot of the power supply node VDDHV.

The illustrated active clamp control circuit 22 includes a trigger circuit 31, a hysteretic buffer 32, a logical AND gate 33, a level shifter 34, a pull-down control transistor 41, a pull-up control transistor 42, a pull-down resistor 43, a gate capacitor 44, and a voltage limiting Zener diode 45.

The trigger circuit 31 detects presence or absence of a transient overstress event based on a voltage difference between the isolated high voltage node VHV and the ground node VSS. As shown in FIG. 2, the trigger circuit 31 includes an integrated timer that generates a trigger signal VTRIG after a time delay. The trigger circuit 31 also includes an integrated voltage regulator that generates a regulated voltage VREG. As shown in FIG. 2, the regulated voltage VREG is used to power logic circuitry of the active clamp control circuit 22, including the hysteretic buffer 32, the logical AND gate 33, and the level shifter 34.

In certain configurations, in response to a transient overstress event, the trigger circuit 31 generates the regulated voltage VREG, which results in the active clamp control circuit 22 turning on the clamp transistor 23. Additionally, after a time delay from generation of the regulated voltage VREG, the trigger circuit 31 activates the trigger signal VTRIG, which results in the active clamp control circuit 22 turning off the clamp transistor 23. In the illustrated embodiment, a trigger signal is activated by gradually transitioning the trigger signal from a logically low value to a logically high value. However, the teachings herein are also applicable to configurations in which a trigger signal is activated by transitioning the trigger signal from a logically high value to a logically low value and to configurations in which a transition of a trigger signal is sudden rather than gradual.

The hysteretic buffer 32 receives the trigger signal VTRIG, and generates a hysteretic trigger signal TRIG. Using logic circuitry that operates with hysteresis provides more stable control over clamp turn-on and turn-off. The logical AND gate 33 controls an input to the level shifter 34 based on the result of a logical AND operation of the regulated voltage VREG and the hysteretic trigger signal TRIG. Additionally, the output of the level shifter 34 controls a gate of the pull-up control transistor 42. The level shifter 34 operates to provide signal conversion between a voltage domain of the regulated voltage VREG and a voltage domain of the power supply node VDDHV. As shown in FIG. 2, the hysteretic trigger signal TRIG controls a gate of the pull-down transistor 41.

The pull-down control transistor 41 and pull-up control transistor 42 operate to pull-down and pull-up, respectively, a voltage of a gate of the clamp transistor 23. Thus, when the hysteretic trigger signal TRIG is logically low, the pull-down control transistor 41 turns off and the pull-up control transistor 42 turns on to activate the clamp transistor 23. Additionally, when the hysteretic trigger signal TRIG is logically high, the pull-down control transistor 42 turns on and the pull-up control transistor 42 turns off to deactivate the clamp transistor 23.

Although one embodiment of logic circuitry is shown in FIG. 2, the teachings herein are applicable to active clamp control circuits that use logic circuitry implemented in a wide variety of ways. Accordingly, other implementations of logic circuitry and/or clamp activation control are possible.

The pull-down resistor 43 and the gate capacitor 44 aid in preventing unintended activation of the clamp transistor 23. For example, the pull-down resistor 43 provides a discharge path between the gate of the clamp transistor 23 and the ground node VSS, thereby helping to prevent voltage build-up that could otherwise inadvertently turn-on the clamp transistor 23. However, the pull-down resistor 43 is of sufficiently large resistance such that the pull-up control transistor 42 pull-ups the gate voltage of the clamp transistor 23 when the trigger circuit 31 detects a transient overstress event. The gate capacitor 44 stabilizes the gate voltage of the clamp transistor 23 and provides filtering that reduces the likelihood of false activation of the clamp transistor 23.

The voltage limiting Zener diode 45 limits a maximum gate voltage of the clamp transistor 23, thereby preventing the clamp transistor 23 from damage when a transient overstress event is present.

Although one example of an active clamp control circuit 22 is shown in FIG. 2, the teachings herein are applicable to other configurations of active clamp control circuits, including, for example, active clamp control circuits implemented using other types of components and/or more or fewer components.

Figure 3:
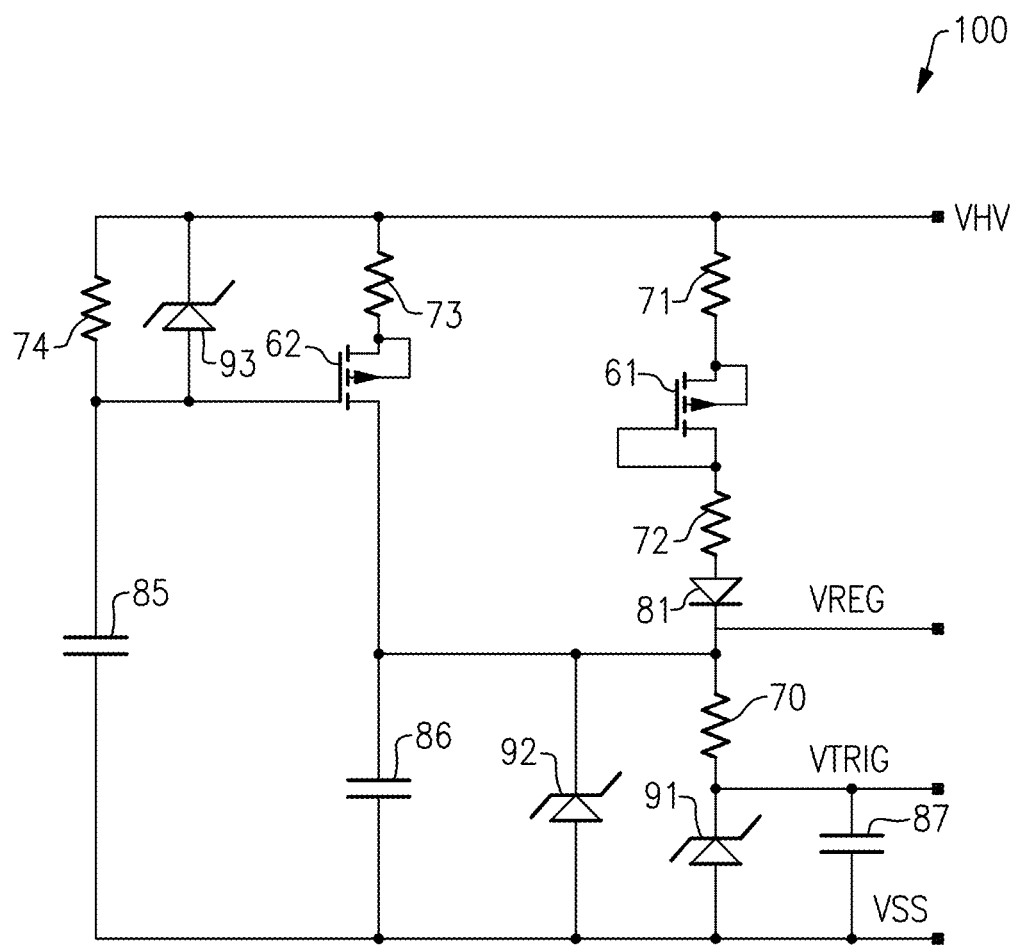
FIG. 3 is a schematic diagram of a trigger circuit according to one embodiment.

FIG. 3 is a schematic diagram of a trigger circuit 100 according to one embodiment. The trigger circuit 100 includes a first regulator transistor 61, a second regulator transistor 62, a timer resistor 70, a first regulator resistor 71, a second regulator resistor 72, a current limiting resistor 73, a gate resistor 74, a regulator diode 81, a gate capacitor 85, a decoupling capacitor 86, a timer capacitor 87, a first voltage limiting Zener diode 91, a second voltage limiting Zener diode 92, and a third voltage limiting Zener diode 93. The trigger circuit 100 is used to generate regulated voltage VREG and a trigger voltage VTRIG.

The trigger circuit 100 of FIG. 3 illustrates one embodiment of the trigger circuit 31 of FIG. 2. However, the teachings herein are applicable to trigger circuits implemented in a wide variety of ways. Accordingly, other implementations of trigger circuits are possible.

The first regulator resistor 71, the first regulator transistor 61, the second regulator resistor 72, and the regulator diode 81 are electrically connected in series between the isolated high voltage node VHV and the regulated voltage VREG, and operate to control the regulated voltage VREG based on the voltage of the isolated high voltage node VHV. During normal operating voltage conditions of an IC, the voltage of the isolated high voltage node VHV is insufficient to pull-up the regulated voltage VREG. Accordingly, the regulated voltage VREG is turned off or deactivated during normal operation of the IC. However, when an overstress event is present, the isolated high voltage VHV increases and provides sufficient forward-bias across the first regulator resistor 71, the first regulator transistor 61, the second regulator resistor 72, and the regulator diode 81 to activate the regulated voltage VREG.

A static power dissipation of the trigger circuit's regulator can be based on a resistance between the isolated high voltage node VHV and the regulated voltage VREG. In one embodiment, the first regulator resistor 71 has a resistance in the range of about 1 k$\Omega$ to about 5 k$\Omega$, and the second resistor 72 has a resistance in the range of about 5 mega-$\Omega$ to about 9 mega-$\Omega$. However, other resistance values are possible.

The gate resistor 74 and the gate capacitor 85 are electrically connected in series between the isolated high voltage node VHV and the ground node VSS, and operate to control the gate of the second regulator transistor 62 based on low pass filtering the voltage difference between the isolated high voltage node VHV and the ground node VSS. Thus, the second regulator transistor 62 controls the regulated voltage VREG based on a low frequency component of the voltage difference between the isolated high voltage node VHV and the ground node VSS.

The second regulator transistor 62 aids in rapidly charging the decoupling capacitor 86 during a transient overstress event, thereby pulling up the regulated voltage VREG relatively quickly. Thus, the aforementioned circuit elements collectively working together can increase the speed at which the trigger circuit 100 activates the regulated voltage VREG in response to detection of a transient overstress event. The current limiting resistor 73 operates to limit a maximum amount of current that can flow through the second regulator transistor 62, thereby preventing the transistor 62 from being damaged by the electrical overstress event. The decoupling capacitor 86 serves to stabilize the regulated voltage VREG, including, for instance, limiting voltage variation in response to switching of logic circuitry powered by the regulated voltage VREG.

The timer resistor 70 and the timer capacitor 87 generate the trigger voltage VTRIG. In the illustrated embodiment, the timer resistor 70 and the timer capacitor 87 operate to control a rise time of the trigger signal VTRIG in response to activation of the regulated voltage VREG. In particular, a rise time of the trigger signal VTRIG is based on a resistor-capacitor (RC) time constant of the timer resistor 70 and the timer capacitor 87.

Accordingly, after the regulated voltage VREG is activated, the trigger voltage VTRIG rises with a time delay that is based on a time constant of the timer resistor 70 and the timer capacitor 87. Thus, the trigger circuit 100 generates the trigger signal VTRIG with a time delay relative to turn on of the regulated voltage VREG. Once the trigger signal VTRIG rises above the threshold voltage of the hysteretic buffer 32 in FIG. 2, the Schmitt trigger changes state, which in turn forces the clamp device 23 of FIG. 2 to change from an ON state to an OFF state.

The first voltage limiting Zener diode 91 operates to a limit a voltage of the trigger signal VTRIG, thereby providing overvoltage protection to circuitry that receives the trigger signal VTRIG, such as transistor gates. Additionally, the second voltage limiting Zener diode 92 operates to limit a voltage of the regulated voltage VREG, thereby providing to circuitry that operates using the regulated voltage. Furthermore, the third voltage limiting Zener diode 93 operates to limit a voltage difference between the gate and source of the second regulator transistor 62.

Figure 4:
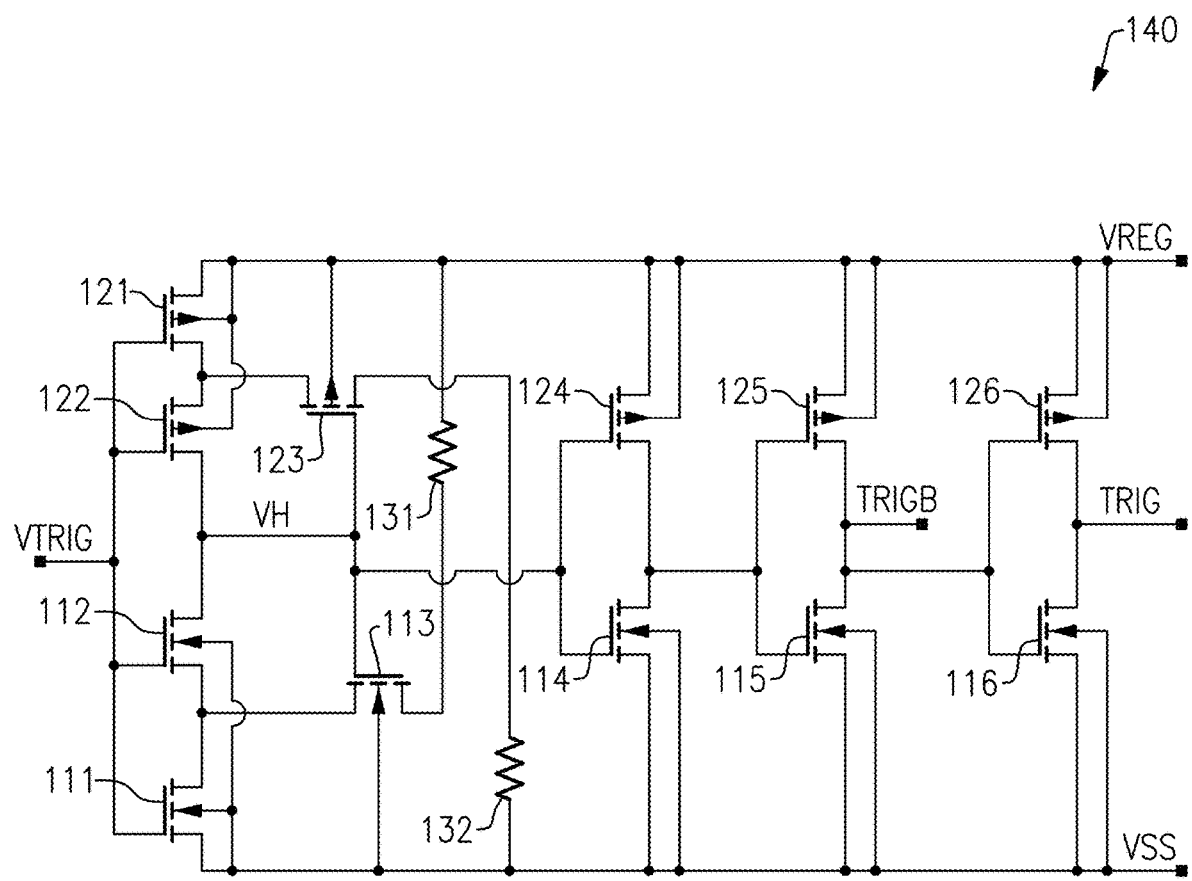
FIG. 4 is a schematic diagram of a hysteretic buffer according to one embodiment.

FIG. 4 is a schematic diagram of a hysteretic buffer 140 according to one embodiment. The hysteretic buffer 140 includes a first input stage n-type metal oxide semiconductor (NMOS) transistor 111, a second input stage NMOS transistor 112, a first input stage p-type metal oxide semiconductor (PMOS) transistor 121, a second input stage PMOS transistor 122, a hysteresis control NMOS transistor 113, a hysteresis control PMOS transistor 123, a first resistor 131, a second resistor 132, a first inverter NMOS transistor 114, a first inverter PMOS transistor 124, a second inverter NMOS transistor 115, a second inverter PMOS transistor 125, and a third inverter NMOS transistor 116, and a third inverter PMOS transistor 126. The hysteretic buffer 140 receives power via the regulated voltage VREG and the ground node VSS.

The hysteretic buffer 140 receives the trigger signal VTRIG, and generates the hysteretic trigger signal TRIG and the inverted hysteretic trigger signal TRIGB using hysteresis. In particular, when the voltage at the node VH is relatively high, the hysteresis control NMOS transistor 113 is turned on and a conductive path through the hysteresis control NMOS transistor 113 and the first resistor 131 provides hysteresis to maintain the voltage of the node VH relatively high. Similarly, when the voltage at the node VH is relatively low, the hysteresis control PMOS transistor 123 is turned on and a conductive path through the hysteresis control PMOS transistor 123 and the second resistor 132 provides hysteresis to maintain the voltage of the node VH relatively low.

Additionally, the voltage of the node VH is processed by a cascade of inverters to generate the hysteretic trigger signal TRIG and the inverted hysteretic trigger signal TRIGB.

The hysteric buffer 140 of FIG. 4 illustrates one implementation of the hysteretic buffer 32 of FIG. 2. Although one example of a hysteretic buffer 140 is shown in FIG. 4, the teachings herein are applicable to other implementations of hysteretic circuitry and/or other configurations of logic circuitry, including, for instance, logic circuitry that operates without hysteresis.

Figure 5:
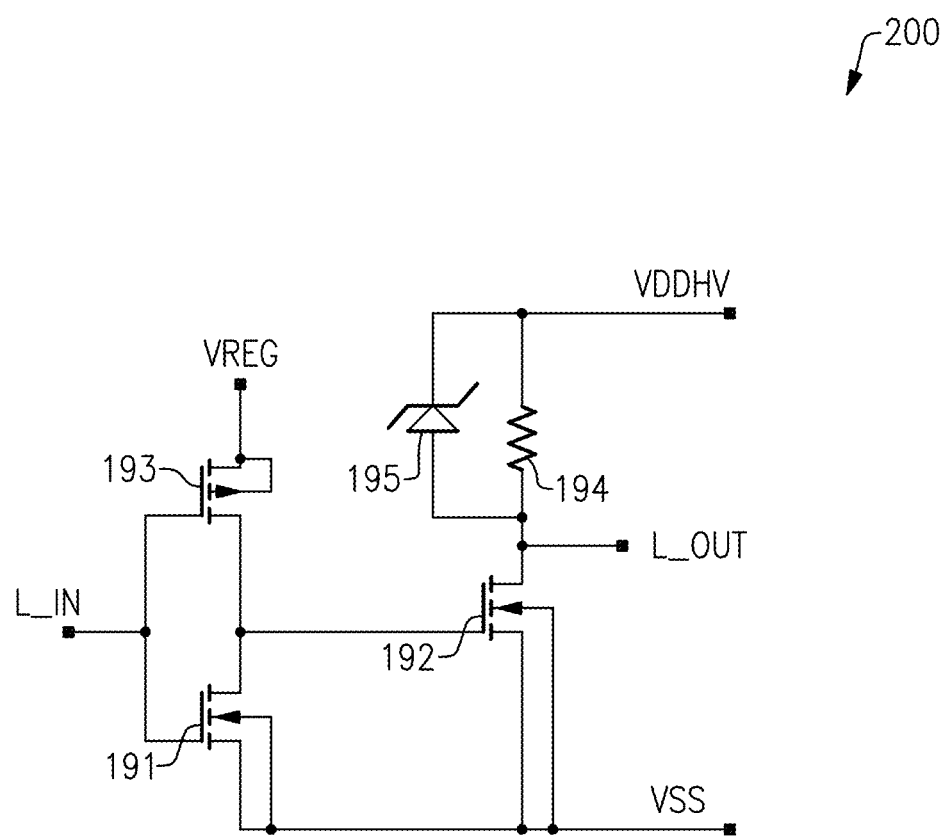
FIG. 5 is a schematic diagram of a level shifter according to one embodiment.

FIG. 5 is a schematic diagram of a level shifter 200 according to one embodiment. The level shifter 200 includes an inverter NMOS transistor 191, a pull-down NMOS transistor 192, an inverter PMOS transistor 193, a pull-up resistor 194, and a voltage limiting Zener diode 195. The level shifter 200 includes a level shifter input L_IN that receives a level shifter input signal, and a level shifter output L_OUT that generates a level shifter output signal. The level shifter 200 serves to level shift the level shifter input signal from a voltage domain of the regulated voltage VREG to a voltage domain of the power supply node VDDHV.

The inverter NMOS transistor 191 and the inverter PMOS transistor 193 operate as an inverter to logically invert the input signal. The inverter receives power via the regulated voltage VREG and the ground node VSS. Additionally, the logically inverted input signal is provided to the gate of the pull-down NMOS transistor 192, which includes a drain connected to the level shifter output L_OUT. The pull-up resistor 194 is electrically connected between the level shifter output L_OUT and the power supply node VDDHV. The voltage limiting Zener diode 195 is connected in parallel with the pull-up resistor 194.

A resistance of the pull-up resistor 194 and an on-state resistance of the pull-down NMOS transistor 192 can be selected to provide a desired output voltage swing of the level shifter 200. In particular, when the pull-down NMOS transistor 192 is turned on, the pull-down NMOS transistor 192 and the pull-up resistor 194 operate as a voltage divider. Accordingly, in this embodiment, the level shifter output L_OUT only swings between about VDDHV and VDDHV less 5.5V, due to the voltage limiting action of Zener diode 195 and the properly sized pull down transistor 192.

The level shifter 200 of FIG. 5 illustrates one implementation of the level shifter 34 of FIG. 2. Although one example of a level shifter is shown in FIG. 5, the teachings herein are applicable to other implementations of level shifters and/or other configurations of logic circuitry, including, for instance, logic circuitry that omits level shifters.

Figure 6:
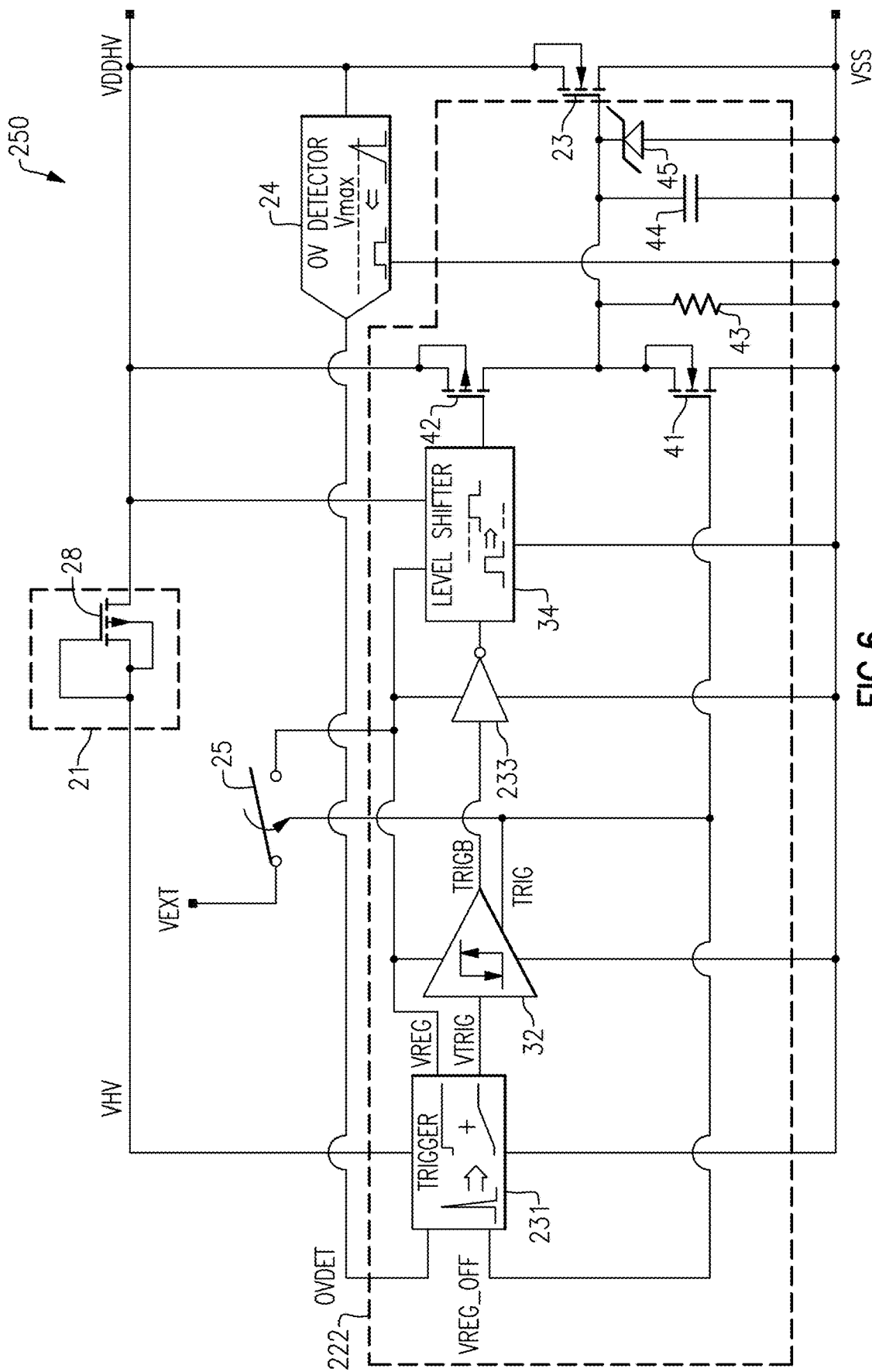
FIG. 6 is a schematic diagram of an actively-controlled high voltage clamp according to another embodiment.

FIG. 6 is a schematic diagram of an actively-controlled high voltage clamp 250 according to another embodiment. The actively-controlled high voltage clamp 250 includes an isolation circuit 21 and a clamp transistor 23, which can be as described earlier with respect to the actively-controlled high voltage clamp 50 of FIG. 2. The actively-controlled high voltage clamp 250 further includes an active clamp control circuit 222, an overvoltage detector 24, and a switch 25.

The illustrated active clamp control circuit 222 includes a hysteretic buffer 32, a level shifter 34, a pull-down control transistor 41, a pull-up control transistor 42, a gate resistor 43, a gate capacitor 44, and a voltage limiting Zener diode 45, which can be as described earlier with respect to the active clamp control circuit 22 of FIG. 2. The active clamp control circuit 222 further includes a trigger circuit 231 and an inverter 233.

In the illustrated embodiment, the trigger circuit 231 generates a regulated voltage VREG in response to detection of a transient overstress event. The trigger circuit 231 also generates a trigger signal VTRIG, which begins with a logically low value and gradually transitions to a logically high value after a time delay, in this embodiment. As shown in FIG. 6, the trigger signal VTRIG is provided to the hysteretic buffer 32, which generates a hysteretic trigger signal TRIG and an inverted hysteretic trigger signal TRIGB. The hysteretic trigger signal TRIG is provided to a control input of the switch 25, to a regulator enable input (VREG_OFF) of the trigger circuit 231, and to a gate of the pull-down control transistor 41. The inverted hysteretic trigger signal TRIG is provided to an input of the inverter 233, which provides an inverted version of the inverted hysteretic trigger signal TRIG to an input of the level-shifter 34.

In response to detection of a transient overstress event, the trigger circuit 231 turns on the regulated voltage VREG and controls the trigger signal VTRIG to a logically low value, in this embodiment. After a time delay of the trigger circuit's timer, the trigger signal VTRIG is activated (corresponding to a logic high, in this example), and the hysteretic trigger signal TRIG closes the switch 25 to connect the regulated voltage VREG to an external voltage VEXT. The hysteretic trigger signal TRIG also turns off the trigger circuit 231 via the regulator's VREG_OFF input of the trigger circuit 231. The hysteric buffer 32 also controls the trigger signal TRIGB to change from logic high to logic low, which forces the clamp element 23 to turn-off.

By including the switch 25 and the external voltage VEXT, the high standing leakage going through the integrated regulator of the trigger circuit 231 is reduced or minimized. Additionally, including the external voltage VEXT helps stabilize the regulated voltage VREG, and thus the clamp transistor 23 and the activate clamp control circuit's logic control circuitry also remain at well-defined biased state. Thus, enhanced performance and lower static dissipation can be achieved.

The illustrated embodiment also includes the overvoltage detector 24 that generates an overvoltage detection signal OVDET based on whether or not the overvoltage detector 24 detects an overvoltage condition between the power supply node VDDHV and the ground node VSS. The overvoltage detection signal OVDET is used to retrigger or reset the trigger circuit 231 by discharging the trigger signal VTRIG to VSS and resetting the timer. In the illustrated embodiment, the overvoltage detection signal OVDET remains deactivated as long as the voltage of the power supply node VDDHV stays below the predefined threshold voltage of the overvoltage detector 24 and thus, does not hinder other circuit operations.

However, when a transient overstress event causes the voltage of the power supply node VDDHV to exceed the predefined threshold voltage, the overvoltage detector 24 generates a logic high signal, in this embodiment, to retrigger or reset the trigger circuit 231 via the overvoltage detection signal OVDET. Thus, if the clamp transistor 23 is turned off, the overvoltage detector 24 can detect overvoltage and reset the trigger circuit 231, thereby providing a mechanism for the clamp transistor 23 to be turned back on again repeatedly until the overstress event is substantially discharged. Thus, the actively-controlled high voltage clamp 250 has a shutdown mechanism for false detection during very fast powered conditions. Additionally, the overvoltage detector 24 provides a retriggering mechanism that allows the clamp transistor 23 to be repeatedly turned on for the full duration of the transient overstress event. Thus, the actively-controlled high voltage clamp 250 can provide protection against overstress events of longer duration relative to the embodiment of FIG. 2.

The overvoltage detector 24 generates the overvoltage detection signal OVDET based on the voltage difference between the power supply node VDDHV and the ground node VSS. In certain implementations, the overvoltage detector 24 activates the overvoltage detection signal OVDET when the voltage difference is greater than a maximum voltage Vmax, and otherwise deactivates the overvoltage detection signal OVDET.

Figure 7:
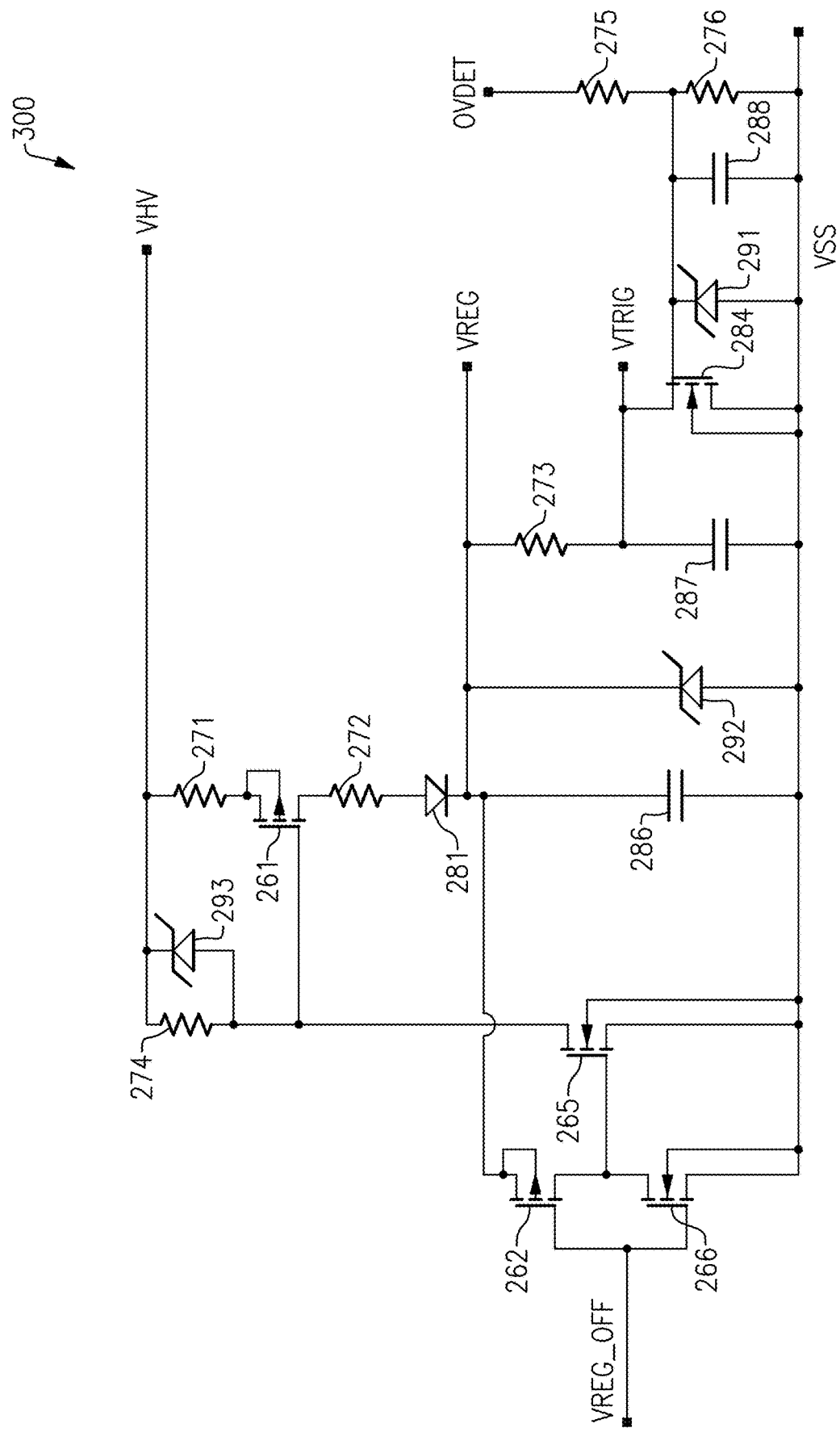
FIG. 7 is a schematic diagram of a trigger circuit according to another embodiment.

FIG. 7 is a schematic diagram of a trigger circuit 300 according to another embodiment. The trigger circuit 300 includes a regulator PMOS transistor 261, an inverter PMOS transistor 262, an inverter NMOS transistor 266, an enable NMOS transistor 265, a first regulator resistor 271, a second regulator resistor 272, a timer resistor 273, a gate pull-up resistor 274, a first voltage divider resistor 275, a second voltage divider resistor 276, a regulator diode 281, a retrigger NMOS transistor 284, a decoupling capacitor 286, a timer capacitor 287, a gate capacitor 288, a first voltage limiting Zener diode 291, a second voltage limiting Zener diode 292, and a third voltage limiting Zener diode 293. The trigger circuit 300 is used to generate a trigger voltage VTRIG and a regulated voltage VREG.

The trigger circuit 300 of FIG. 7 illustrates one embodiment of the trigger circuit 231 of FIG. 6. However, the teachings herein are applicable to trigger circuits implemented in a wide variety of ways. Accordingly, other implementations of trigger circuits are possible.

The first regulator resistor 271, the regulator PMOS transistor 261, the second regulator resistor 272, and the regulator diode 281 are electrically connected in series between the isolated high voltage node VHV and the regulated voltage VREG, and operate to control the regulated voltage VREG based on the voltage of the isolated high voltage node VHV. During normal operating voltage conditions of an IC, the voltage of the isolated high voltage node VHV is insufficient to pull-up the regulated voltage VREG. Accordingly, the regulated voltage VREG is turned off or deactivated during normal operation of the IC. However, when an overstress event is present, the isolated high voltage VHV increases to a voltage level sufficient to activate the regulated voltage VREG. The decoupling capacitor 286 serves to stabilize the regulated voltage VREG.

A static power dissipation of the trigger circuit's regulator can be based on a resistance between the isolated high voltage node VHV and the regulated voltage VREG. In one embodiment, the first regulator resistor 271 has a resistance in the range of about 4 kΩ to about 8 kΩ, and the second resistor 272 has a resistance in the range of about 0.3 mega-Ω to about 0.7 mega-Ω. However, other resistance values are possible.

When the regulator enable NMOS transistor 265 is turned on, the regulator enable NMOS transistor 265 pulls the gate voltage of regulator PMOS transistor 261 low to turn on the trigger circuit's integrated voltage regulator. However, when the regulator enable NMOS transistor 265 is turned off, the gate pull-up resistor 274 serves to pull-up the gate voltage of the regulator PMOS transistor 261 to turn off the integrated voltage regulator. As shown in FIG. 7, the regulator enable NMOS transistor 265 is controlled by a logic inverter that receives an enable signal at the regulator enable input VREG_OFF.

The timer resistor 273 and the timer capacitor 287 generate the trigger voltage VTRIG. In the illustrated embodiment, the timer resistor 273 and the timer capacitor 287 operate to control a rise time of the trigger signal VTRIG in response to activation of the regulated voltage VREG. In particular, a rise time of the trigger signal VTRIG is based on an RC time constant of the timer resistor 273 and the timer capacitor 287. Thus, the trigger circuit 300 generates the trigger signal VTRIG with a time delay relative to activation of the regulated voltage VREG.

The retrigger NMOS transistor 284 serves to retrigger or reset the trigger circuit's timer in response to activation of the overvoltage detection signal DET. In particular, when the overvoltage detection signal DET is logically high, the voltage divider resistors 275 and 276 control the gate voltage of the retrigger NMOS transistor 284 to pull the trigger voltage VTRIG low, thereby resetting the timer. Thus, the trigger voltage VTRIG is deactivated or reset by the overvoltage detection signal OVDET.

The first voltage limiting Zener diode 291 operates to limit a voltage at the gate of the retrigger NMOS transistor 284. Additionally, the gate capacitor 288 stabilizes the gate voltage of the retrigger NMOS transistor 284, thereby helping to prevent unintended retriggering. Furthermore, the second voltage limiting Zener diode 292 operates to a limit a voltage of the regulated voltage VREG, thereby providing to circuitry that operates using the regulated voltage. Furthermore, the third voltage limiting Zener diode 293 operates to limit a voltage difference between the gate and source of the regulator PMOS transistor 261.

Figure 8:
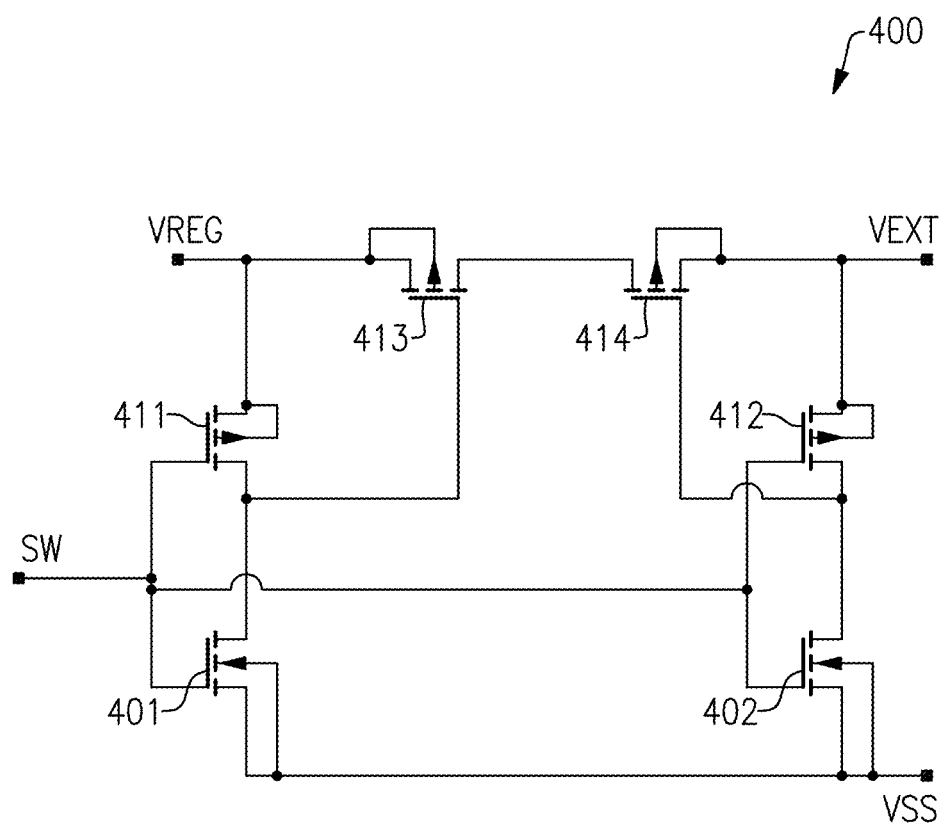
FIG. 8 is a schematic diagram of a switch according to one embodiment.

FIG. 8 is a schematic diagram of a switch 400 according to one embodiment. The switch 400 includes a first inverter NMOS transistor 401, a first inverter PMOS transistor 411, a second inverter NMOS transistor 402, a second inverter PMOS transistor 412, a first switch PMOS transistor 413, and a second switch PMOS transistor 414.

As shown in FIG. 8, the first and second switch PMOS transistor 413, 414 are electrically connected in series between the regulator voltage VREG and the external voltage VEXT. Additionally, the switch 400 receives a switch enable signal SW, which is used to selectively turn on or off the first and second switch PMOS transistors 413, 414. Thus, the switch enable signal SW controls the first and second switch PMOS transistors 413, 414 to open or close the switch 400.

The switch 400 of FIG. 8 illustrates one implementation of the switch 25 of FIG. 6. Although one example of a switch is shown in FIG. 8, the teachings herein are applicable to other implementations of switches and to configurations that operate without a switch to an external voltage.

Figure 9A:
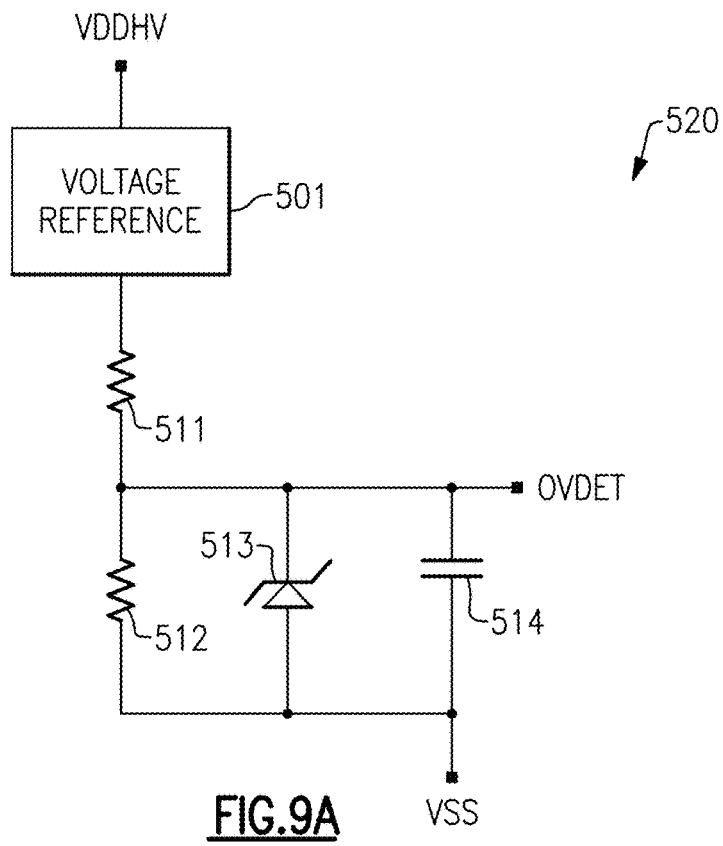
FIG. 9A is a schematic diagram of an overvoltage detector according to one embodiment.

FIG. 9A is a schematic diagram of an overvoltage detector 520 according to one embodiment. The overvoltage detector 520 includes a voltage reference circuit 501, a first voltage divider resistor 511, a second voltage divider resistor 512, a voltage limiting Zener diode 513, and a capacitor 514.

The overvoltage detector 520 of FIG. 9A illustrates one embodiment of the overvoltage detector 24 of FIG. 6. However, the teachings herein are applicable to overvoltage detectors implemented in a wide variety of ways as well as to configurations that omit overvoltage detectors.

The voltage reference 501 generates an output voltage indicative of whether or not the voltage of the power supply node VDDHV exceeds a maximum voltage Vmax. In certain implementations, the maximum voltage Vmax is determined based on a design implementation of the voltage reference 501. The maximum voltage Vmax is greater than the nominal operating voltage of the power supply node VDDHV, such that the voltage reference 501 generates an output voltage that indicates presence of a transient overstress event at the power supply node VDDHV. Additionally, the first and second voltage divider resistors 511, 512 operate as a voltage divider to control the overvoltage detection signal OVDET based on the output voltage of the voltage reference 501. By selecting a resistance ratio of the first and second voltage divider resistors 511, 512, a desired voltage level for logically high value of the overvoltage detection signal OVDET can be achieved.

Accordingly, in the illustrated embodiment, the overvoltage detection signal OVDET has a logically high value when the voltage of the power supply node VDDHV exceeds a voltage Vmax, and a logically low value otherwise. However, the teachings herein are also applicable to configurations in which a logically low value represents an overvoltage condition and a logically high value represents no overvoltage condition.

Figure 9B:
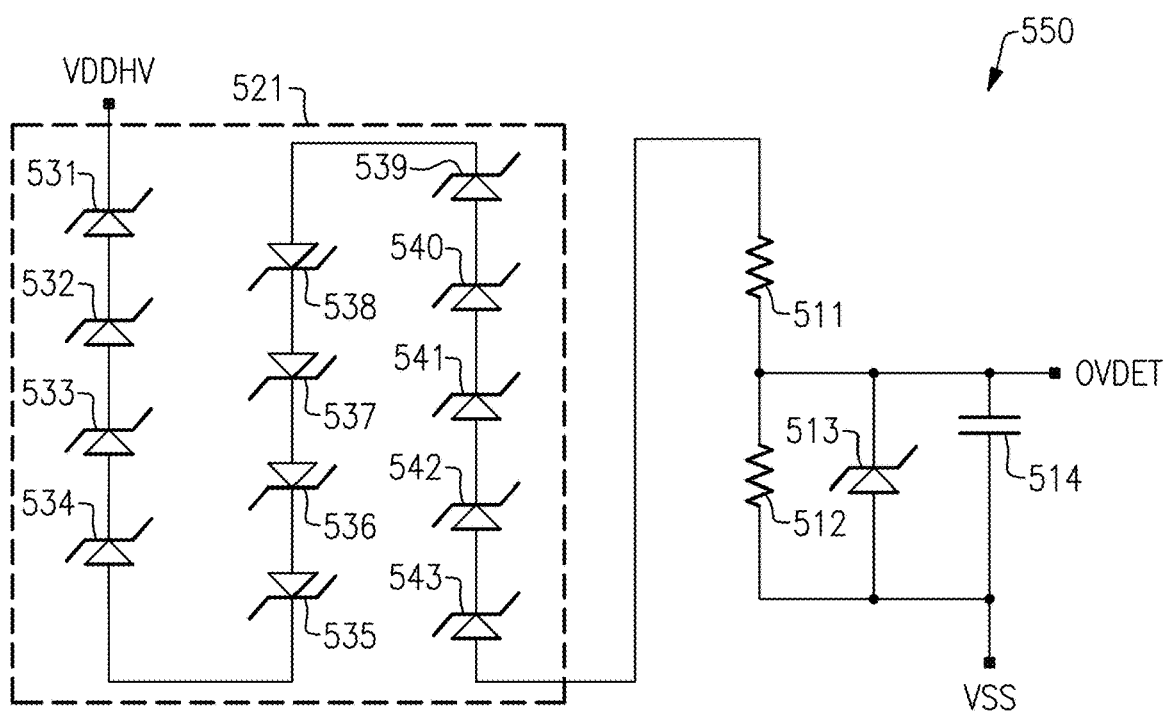
FIG. 9B is a schematic diagram of an overvoltage detector according to another embodiment.

FIG. 9B is a schematic diagram of an overvoltage detector 550 according to another embodiment. The overvoltage detector 550 includes a voltage reference circuit 521, a first voltage divider resistor 511, a second voltage divider resistor 512, a voltage limiting Zener diode 513, and a capacitor 514.

The overvoltage detector 550 of FIG. 9B is similar to the overvoltage detector 520 of FIG. 9A, except that the overvoltage detector 550 of FIG. 9B illustrates a specific implementation of a voltage reference circuit. In particular, the voltage reference circuit 521 of FIG. 9B includes thirteen Zener diodes 531-543 electrically connected in series from cathode-to-anode between the power supply node VDDHV and an output of the overvoltage detector 550. Other types of overvoltage detector can be implemented as well by using other semiconductor devices such as MOSFET, diode, or bipolar devices, or a combination thereof.

By including a desired number of Zener diodes in series, a desired value of the maximum voltage Vmax used for overvoltage comparison can be achieved. For example, when the forward voltage of each Zener diode is about 5.4 V, a voltage Vmax of about 70.2 V can be provided for overvoltage detection.

Although one specific implementation of an overvoltage detector is shown is FIG. 9B, the teachings herein are applicable to overvoltage detectors implemented in a wide variety of ways as well as to configurations that omit overvoltage detectors.

Figure 10:
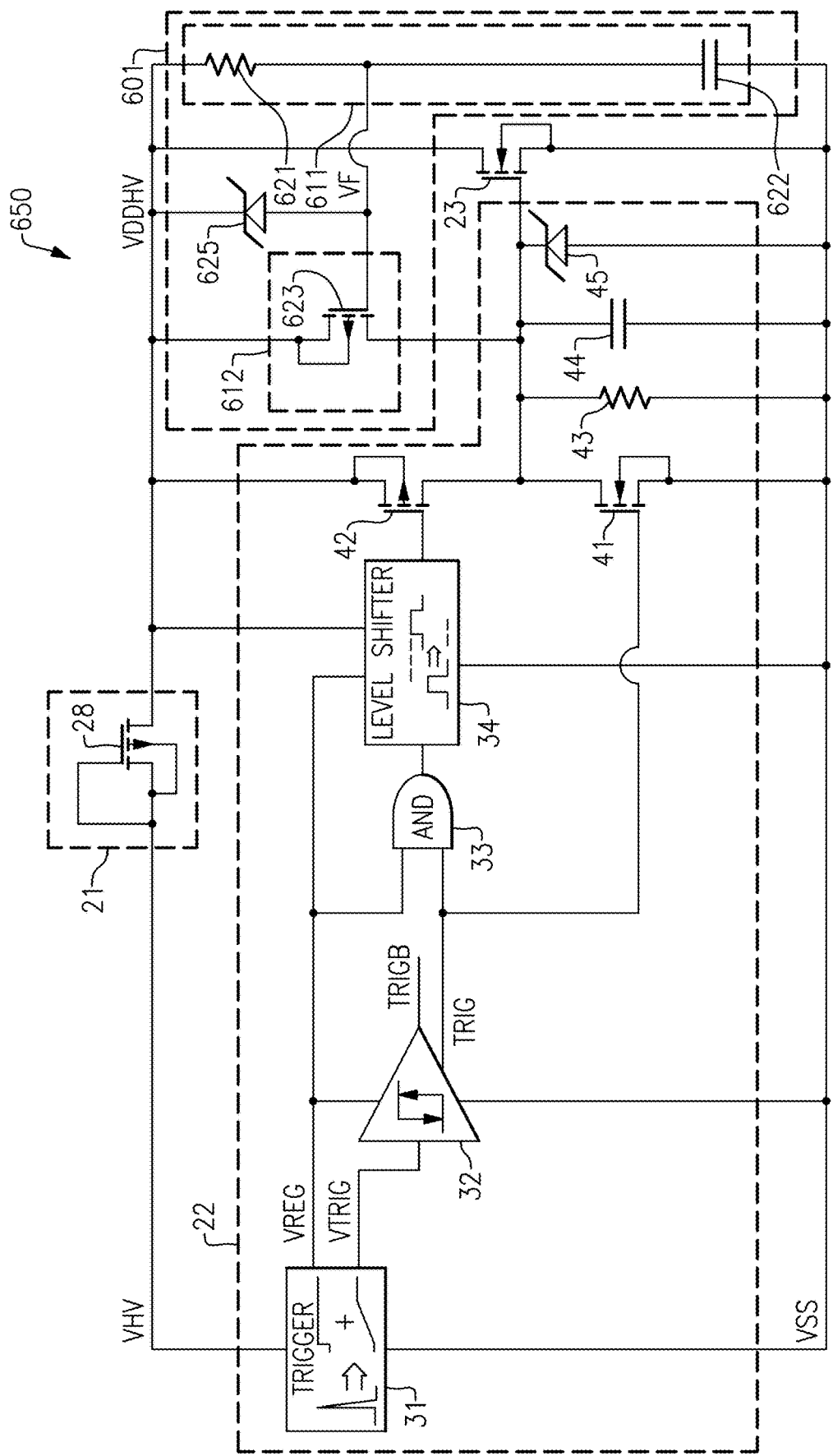
FIG. 10 is a schematic diagram of an actively-controlled high voltage clamp according to another embodiment.

FIG. 10 is a schematic diagram of an actively-controlled high voltage clamp 650 according to another embodiment. The actively-controlled high voltage clamp 650 of FIG. 10 includes an isolation circuit 21, an active clamp control circuit 22, and a clamp transistor 23, which can be as described earlier with respect to the actively-controlled high voltage clamp 50 of FIG. 2. However, in contrast to the actively-controlled high voltage clamp 50 of FIG. 2, the actively-controlled high voltage clamp 650 further includes an active feedback circuit 601.

The illustrated active feedback circuit 601 includes a feedback enable circuit 611, a feedback circuit 612, and a voltage limiting Zener diode 625. Although one example of an active feedback circuit is shown in FIG. 10, the teachings herein are applicable to active feedback circuits implemented in a wide variety of ways as well as to configurations that omit active feedback.

The feedback enable circuit 611 generates a feedback voltage VF based on low pass filtering a voltage difference between the power supply node VDDHV and the ground node VSS. In the illustrated embodiment, the feedback enable circuit 611 includes a resistor 621 and a capacitor 622 electrically connected in series between the power supply node VDDHV and the ground node VSS.

The feedback circuit 612 includes a feedback transistor 623, which is electrically connected between the power supply node VDDHV and a gate of the clamp transistor 23. As shown in FIG. 10, a gate of the feedback transistor 623 is controlled using the feedback voltage VF. Accordingly, the feedback enable circuit 611 is used to control an amount of feedback provided by the feedback transistor 623 based on low pass filtering the voltage difference between the power supply node VDDHV and the ground node VSS.

When a transient overstress event is received between the power supply node VDDHV and the ground node VSS, the feedback enable circuit 611 enables the feedback transistor 623. Additionally, the feedback transistor 623 remains turned on for an amount of time that is based on a time constant of the resistor 621 and the capacitor 622. When the feedback transistor 623 is turned on, the gate voltage of the clamp transistor 23 can track or change with the voltage of the power supply node VDDHV. The gate voltage of the clamp transistor 23 can track the power supply node VDDHV while the transient overstress event is present. After passage of the transient overstress event, the voltage of the power supply node VDDHV decreases, and the feedback transistor 623 turn offs.

Including the active feedback circuit 601 aids in providing feedback that can relax a design constraint of the trigger circuit 31 and/or safely permit a time delay of the timer to be shorter. For example, a resistor-capacitor network of a timer of the trigger circuit 31 can be implemented using smaller components and a shorter time delay.

When the power supply node VDDHV is powered, the feedback voltage VF is controlled to be about equal to the voltage of the power supply node VDDHV. Thus, the active feedback circuit 612 is disabled during powered operation.

Figure 11A:
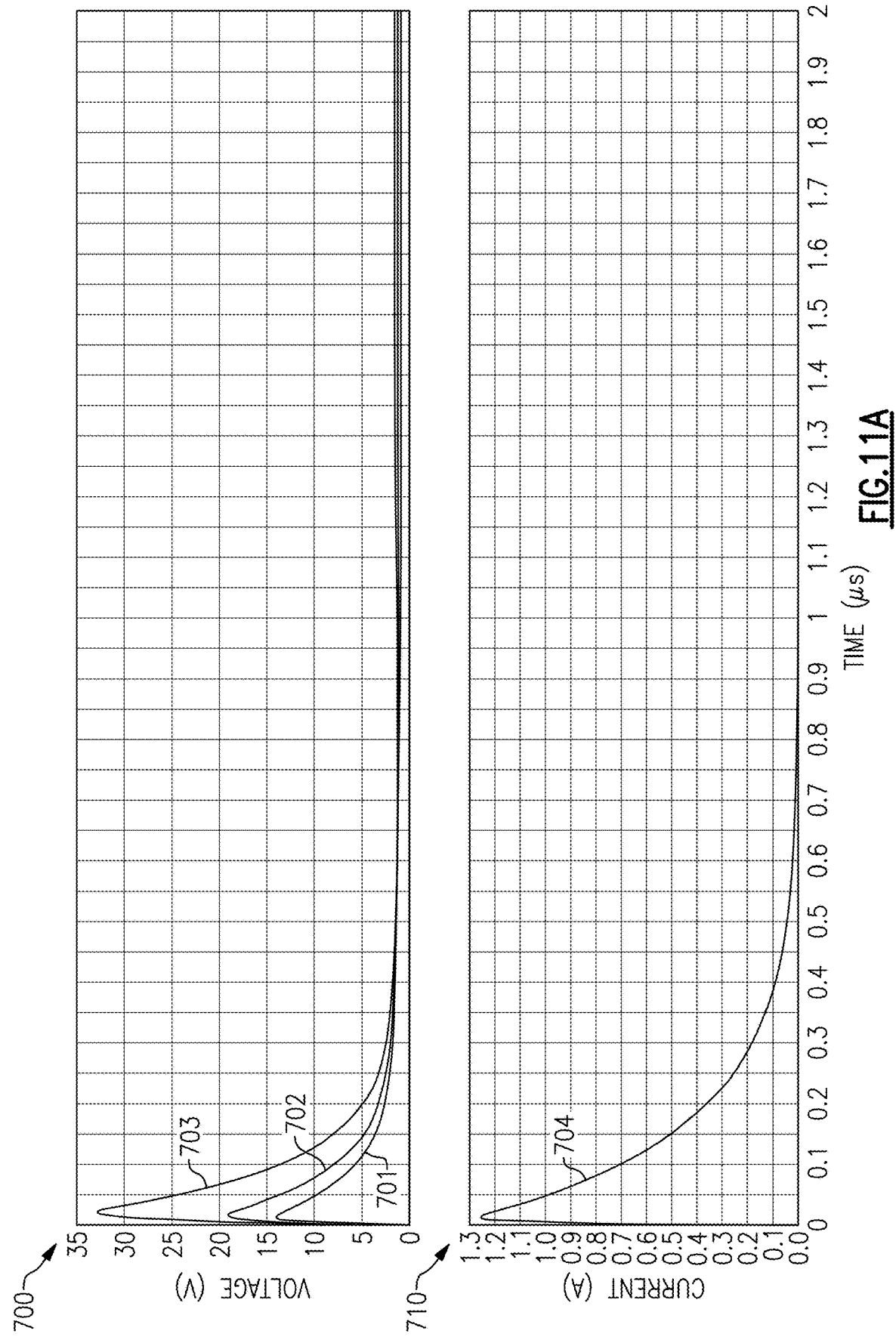
FIG. 11A illustrates one example of graphs of voltage and current versus time for an actively-controlled high voltage clamp.

FIG. 11A illustrates one example of graphs of voltage and current versus time for an actively-controlled high voltage clamp. FIG. 11A includes a first graph 700 of voltage versus time for different temperature simulations and a second graph 710 of superimposed current versus time at different temperature. The first and second graphs 700, 710 correspond to simulations of a 2 kV human body model (HBM) ESD event for one implementation of the actively-controlled high voltage clamp 250 of FIG. 6 designed for 60 V nominal supply voltage operation. The first and second graphs 700, 710 correspond to simulations of the actively-controlled high voltage clamp in an unpowered condition.

The first graph 700 includes a first voltage versus time plot 701 of the power supply node VDDHV for a 2 kV HBM ESD event at −40° C. The first graph 700 further includes a second voltage versus time plot 702 of the power supply node VDDHV for a 2 kV HBM ESD event at 25° C. The first graph 700 further includes a third voltage versus time plot 703 of the power supply node VDDHV for a 2 kV HBM ESD event at 125° C.

The second graph 710 includes a plot 704 of current through the clamp transistor 23 versus time. The plot 704 corresponds to simulated current at −40° C. Plots for simulations at 25° C. and 125° C. are similar, and thus have been omitted from FIG. 11A for clarity of the figures.

As shown in FIG. 11A, a peak overshoot voltage of the actively-controlled high voltage clamp is about 33 V, which is less than the 60 V nominal voltage difference between the power supply node VDDHV and the ground node VSS, in this example. Thus, in the illustrated example, when a 2 kV HBM event is provided between power and ground pins on the IC in an unpowered condition, the actively-controlled high voltage clamp limits the maximum overvoltage to be less than a nominal operating voltage between the power and ground pins.

Although FIG. 11A illustrates specific simulation results, a wide variety of results are possible, including, for example, results that depend on design implementation, application, and/or manufacturing processes.

Figure 11B:
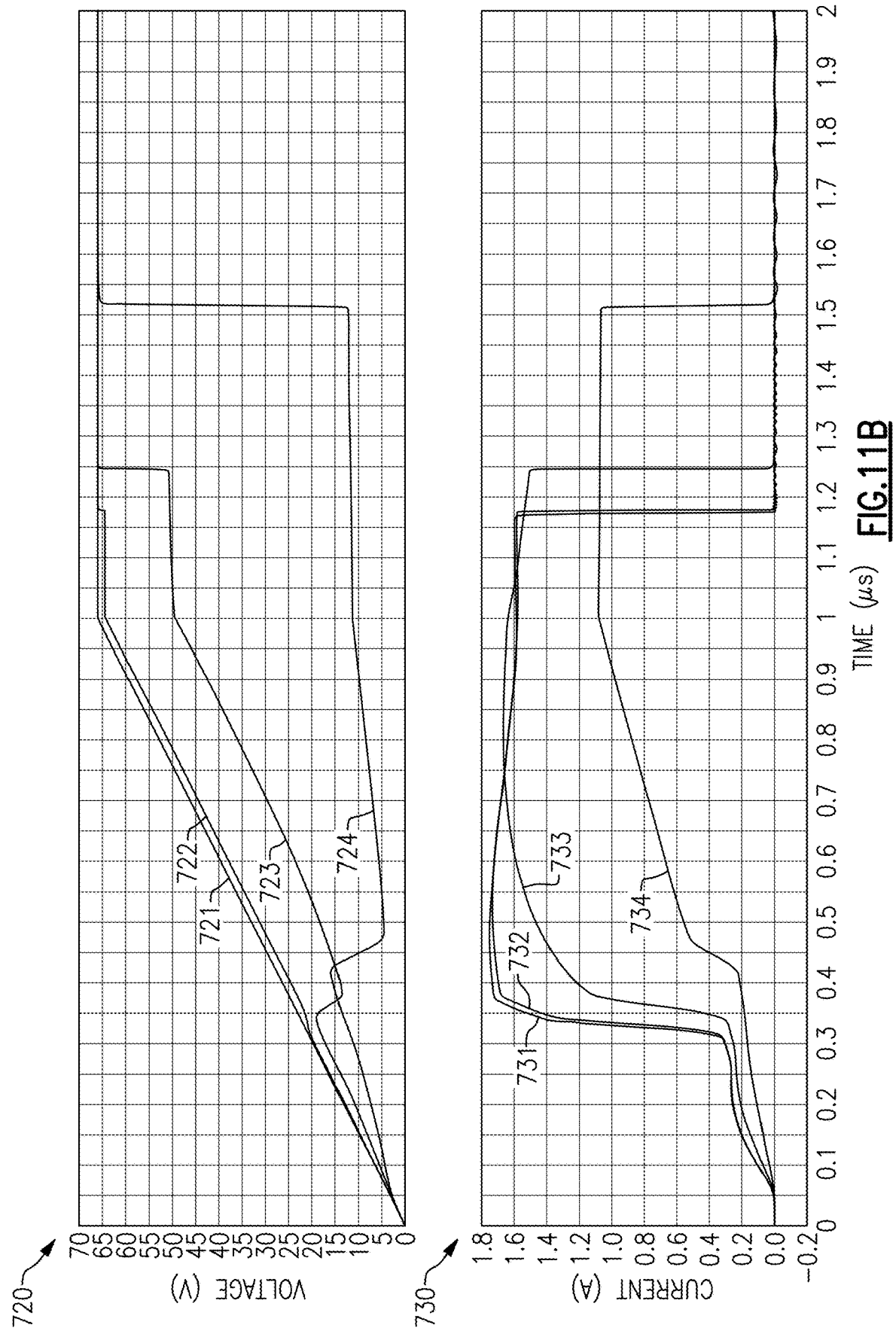
FIG. 11B illustrates another example of graphs of voltage and current versus time for an actively-controlled high voltage clamp.

FIG. 11B illustrates another example of graphs of voltage and current versus time for an actively-controlled high voltage clamp. The first and second graphs 720, 730 correspond to simulations of a power supply ramp up from 0 V at 0 μs to 66 V at 1 μs for one implementation of the actively-controlled high voltage clamp 250 of FIG. 6. The simulations include plots corresponding to different simulated values of input resistance between a system pin being ramped up and the power supply node.

The first graph 720 includes a first plot 721 of voltage versus time with an input resistance of 0Ω, a second plot 722 of voltage versus time with an input resistance of 1Ω, a third plot 723 of voltage versus time with an input resistance of 10Ω, and a fourth plot 724 of voltage versus time with an input resistance of 50Ω. The second graph 730 includes a first plot 731 of clamp current versus time with an input resistance of 0Ω, a second plot 732 of clamp current versus time with an input resistance of 1Ω, a third plot 733 of clamp current versus time with an input resistance of 10Ω, and a fourth plot 734 of clamp current versus time with an input resistance of 50Ω.

As shown in FIG. 11B, even when the actively-controlled high voltage clamp is triggered during a power supply ramp, the actively-controlled high voltage clamp is turned off after a time delay of the timer. Accordingly, FIG. 11B illustrates one example of false detection shutdown.

Figure 11C:
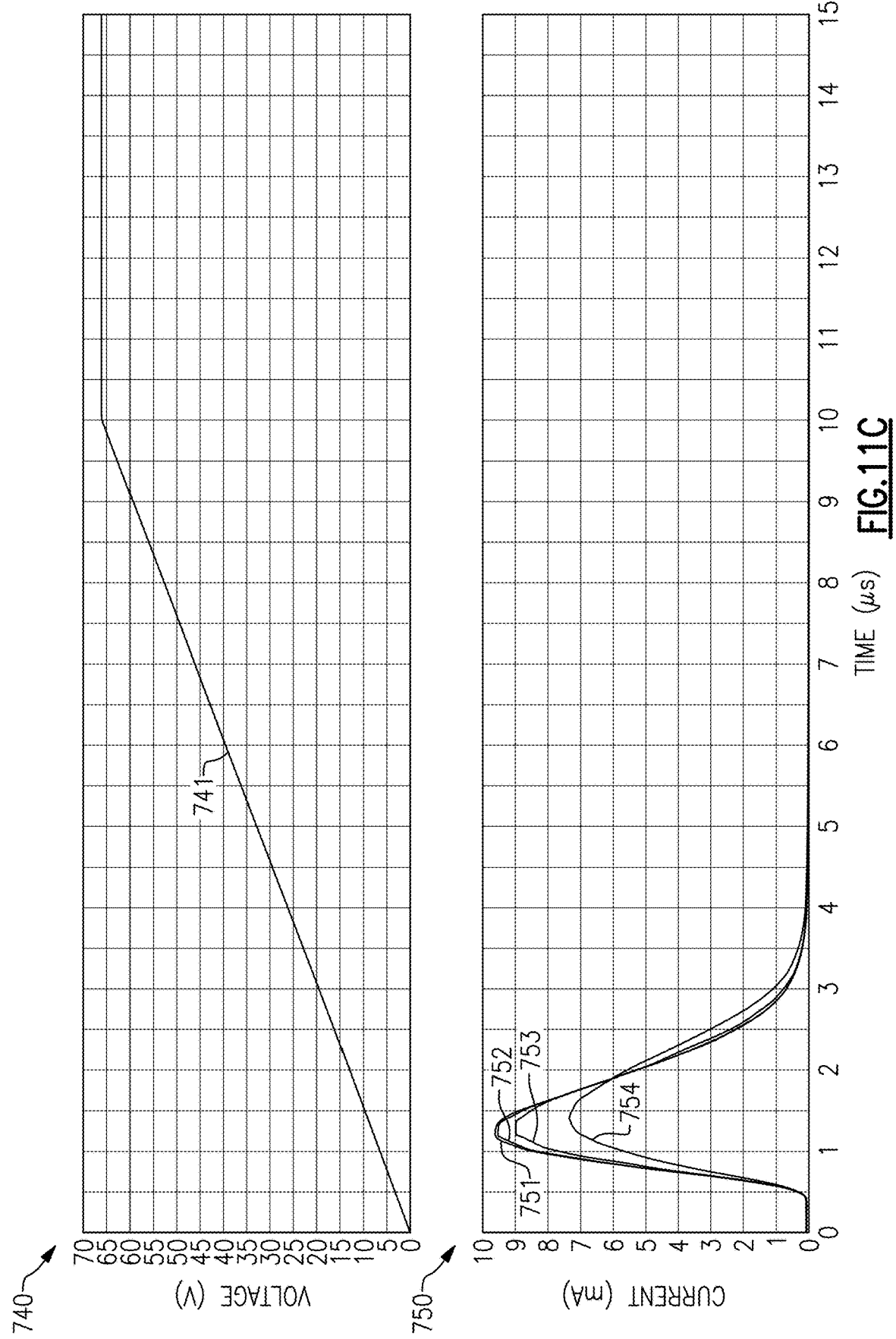
FIG. 11C illustrates another example of graphs of voltage and current versus time for an actively-controlled high voltage clamp.

FIG. 11C illustrates another example of graphs of voltage and current versus time for an actively-controlled high voltage clamp. The first and second graphs 740, 750 correspond to simulations of a power supply ramp up from 0 V at 0 μs to 66 V at 10 μs for one implementation of the actively-controlled high voltage clamp 250 of FIG. 6. The simulations include plots corresponding to different simulated values of input resistance between the system pin being ramped up and the power supply node.

The first graph 740 includes a first plot 721 of voltage versus time with an input resistance of 0Ω. Plots for simulations win input resistances of 1 Ω, 10Ω, and 50Ω are similar, and thus have been omitted from FIG. 11C for clarity of the figures. The second graph 750 includes a first plot 751 of clamp current versus time with an input resistance of 0Ω, a second plot 752 of clamp current versus time with an input resistance of 1Ω, a third plot 753 of clamp current versus time with an input resistance of 10Ω, and a fourth plot 754 of clamp current versus time with an input resistance of 50Ω.

As shown in FIG. 11C, the illustrated clamp exhibits immunity to false triggering in the presence of a power supply ramp-up time of 10 μs for a variety of input resistance values.

Figure 11D:
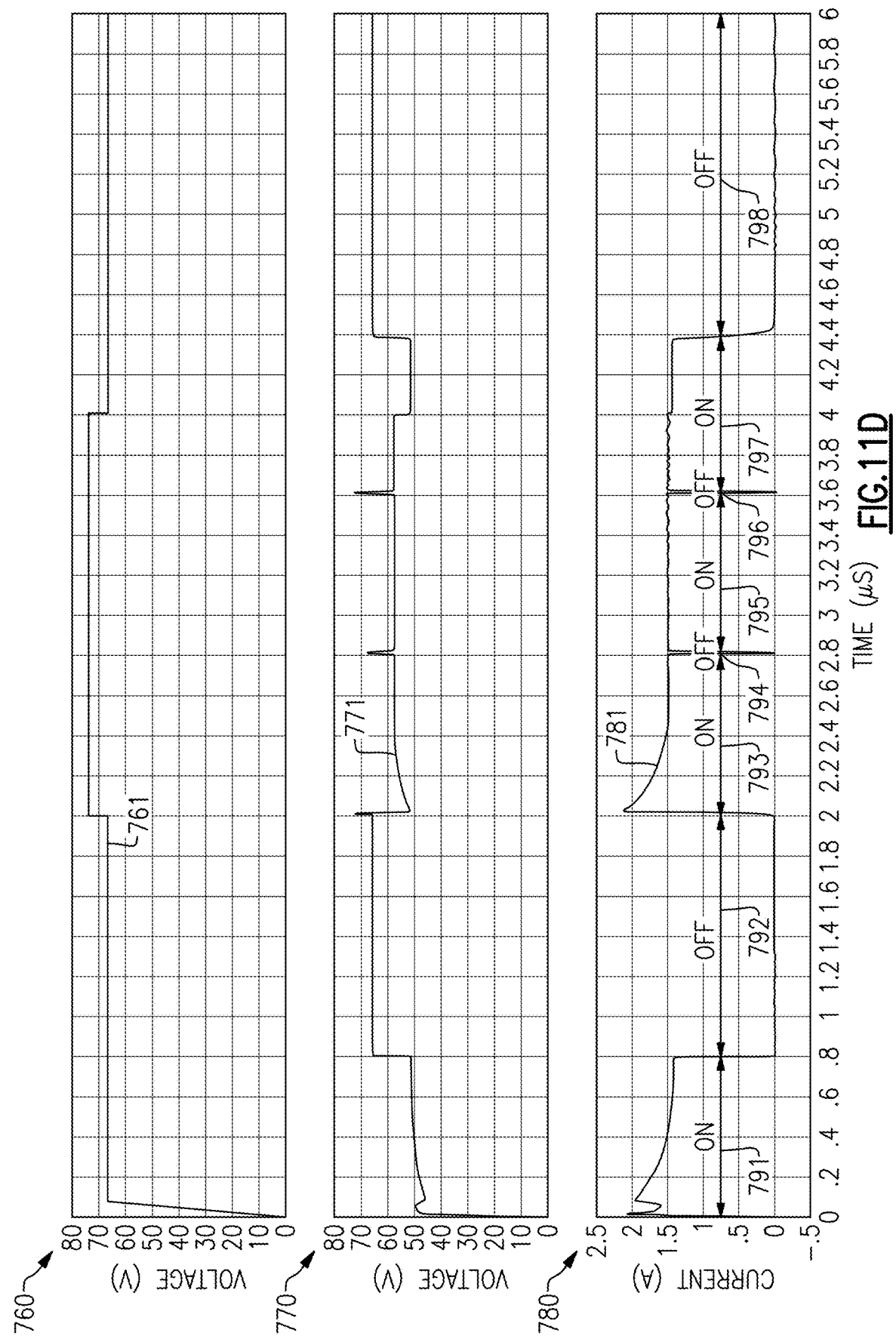
FIG. 11D illustrates another example of graphs of voltage and current versus time for an actively-controlled high voltage clamp.

FIG. 11D illustrates another example of graphs of voltage and current versus time for an actively-controlled high voltage clamp. The graphs 760, 770, and 780 correspond to a simulation of a power supply ramp-up and subsequent overvoltage condition for one implementation of the actively-controlled high voltage clamp 250 of FIG. 6. The graphs 760, 770, and 780 are simulated with an input resistance of 10Ω between the system pin being ramped up and the power supply node. The first graph 760 includes a first plot 761 of system pin voltage versus time, the second graph 770 includes a second plot 771 of the voltage of the power supply node VDDHV versus time, and the third graph 780 includes a third plot 781 of clamp current versus time.

As shown in FIG. 11D, the clamp turns on over a first time window 791 in response to a rapid ramp of the power supply voltage. After a time delay of the timer, the clamp turns off and is deactivated over a second time window 792. The power supply is simulated to have an overvoltage level of 72 V at time 2 μs, which results in the clamp turning on over a third time window 793. Since the clamp is turned on over the third time window 793, clamping pulls the voltage of the power supply node VDDHV down, as shown by the second plot 771. After a time delay of the timer, the clamp momentarily turns off over a fourth time window 794, and the voltage of the power supply node VDDHV increases since the clamp is turned off. The rise of voltage causes the overvoltage detector 24 of FIG. 6 to reset the trigger circuit's timer, and thereafter the clamp turns on over a fifth time window 795. After a time delay of the timer, the clamp turns off momentarily over a sixth time window 796. Thereafter, the overvoltage detector 24 of FIG. 6 resets the trigger circuit's timer, and the clamp turns on over a seventh time window 797. After a time delay of the timer, the clamp turns off. Since the voltage of the supply pin no longer operates with an overvoltage level, the overvoltage detector does not reset the trigger circuit's timer, and the clamp remains turned off during an eighth time window 798.

Although FIGS. 11A-11D illustrates one example of simulation results for an actively-controlled high voltage clamp, other simulation results are possible, including results that depend on implementation, application, and/or processing technology.

In certain implementations herein, an actively-controlled high voltage clamp includes a clamp and a dual resistor-capacitor (RC) trigger circuit that controls activation and shutdown of the clamp. The clamp is electrically connected between a first node (for instance, a power supply node) and a second node (for instance, a ground node). The dual RC trigger circuit includes an RC detection circuit that activates the active feedback circuit in response to detecting a transient overstress event between the first node and the second node. Once activated, the active feedback circuit provides feedback based on voltage conditions of the first and second nodes to maintain the clamp turned on during the overstress event. The dual RC trigger circuit further includes an RC shutdown circuit that generates a shutdown control signal for the clamp shutdown circuit based on low pass filtering a voltage difference between the first node and the second node.

Figure 12A:
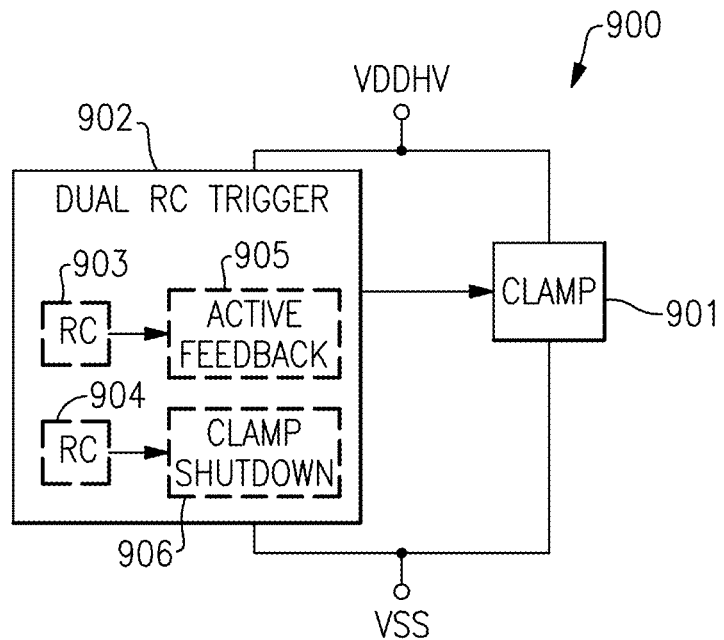
FIG. 12A is a schematic diagram of an actively-controlled high voltage clamp according to another embodiment.

FIG. 12A is a schematic diagram of an actively-controlled high voltage clamp 900 according to another embodiment. The actively-controlled high voltage clamp 900 includes a clamp 901 and a dual RC trigger circuit 902. The clamp 901 is electrically connected between a power supply node VDDHV and a ground node VSS, in this embodiment. Additionally, the dual RC trigger circuit 902 is electrically connected between the power supply node VDDHV and the ground node VSS, and controls turn-on and turn-off of the clamp 901.

The illustrated dual RC trigger circuit 902 includes an RC detection circuit 903, an RC shutdown circuit 904, an active feedback circuit 905, and a clamp shutdown circuit 906.

The RC detection circuit 903 generates an activation signal for the active feedback circuit 905 based on observing a rate of voltage change between the power supply node VDDHV and the ground node VSS. For example, in one embodiment, the RC detection circuit 903 determines that a transient overstress event is present in response to detecting a rapidly changing voltage for a sufficient period of time, such as a rising edge having a rate of voltage change in the range of about 0.1 V/ns to about 100 V/ns for a length of time in the range of about 1 ns to about 1000 ns.

The active feedback circuit 905 provides feedback to the clamp circuit 901 based on voltage conditions of the power supply node VDDHV and the ground node VSS. For example, the clamp 901 can be implemented as a MOS transistor, and the active feedback circuit 905 can control a gate voltage of the MOS transistor based on the voltage difference between the power supply node VDDHV and the ground node VSS. Thus, when a transient overstress event causes a voltage difference between the power supply node VDDHV and the ground node VSS to be relatively large, the active feedback circuit 905 provides a feedback signal to decrease the channel impedance of the MOS transistor.

The RC shutdown circuit 904 generates a shutdown signal for the clamp shutdown circuit 906 based on low pass filtering a voltage difference between the power supply node VDDHV and the ground node VSS. Thus, the RC shutdown circuit 904 detects passage of the transient overstress event, and generates a shutdown control signal that controls the clamp shutdown circuit 906 to turn off the clamp 901.

In one embodiment, an RC time constant of the RC shutdown circuit 904 is greater than an RC time constant of the RC detection circuit 903. Implementing the dual RC trigger circuit 902 in this manner provides reliable shutdown of the clamp 901 during power-up sequence, such as when the power supply node VDDHV is ramped during start-up.

Figure 12B:
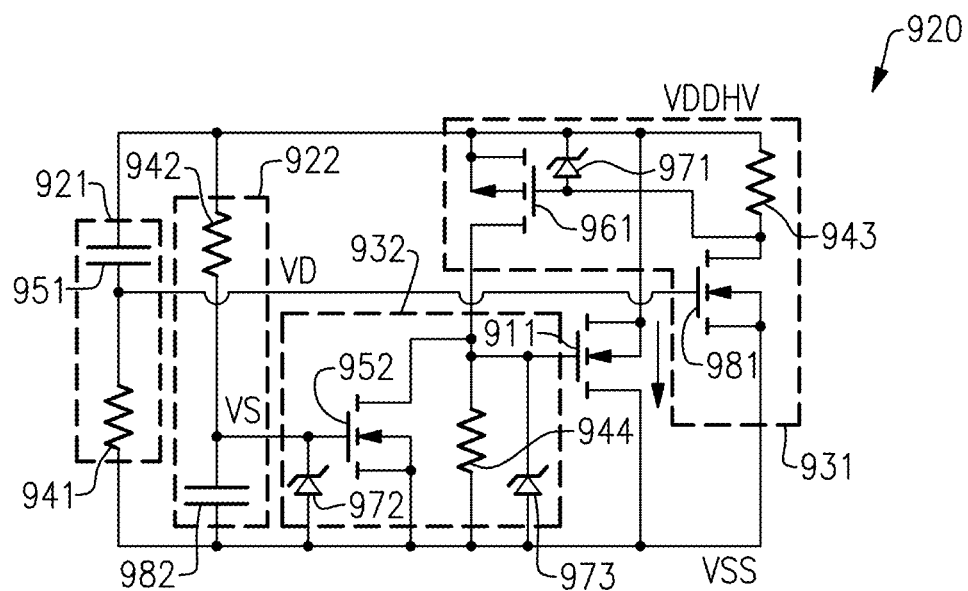
FIG. 12B is a schematic diagram of an actively-controlled high voltage clamp according to another embodiment.

FIG. 12B is a schematic diagram of an actively-controlled high voltage clamp 920 according to another embodiment. The actively-controlled high voltage clamp 920 includes a clamp transistor 911 and a dual RC trigger circuit that includes an RC detection circuit 921, an RC shutdown circuit 922, an active feedback circuit 931, and a clamp shutdown circuit 932.

The actively-controlled high voltage clamp 920 of FIG. 12B illustrates one embodiment of the actively-controlled high voltage clamp 900 of FIG. 12A. However, the actively-controlled high voltage clamp 900 of FIG. 12A can be implemented in other ways, including, for example, configurations using more or fewer components and/or a different arrangement of components.

In the illustrated embodiment, the clamp transistor 911 is implemented as an NMOS transistor, and includes a source electrically connected to the ground node VSS, a drain electrically connected to the power supply node VDDHV, a body electrically connected to the power supply node VDDHV, and a gate that is controlled by both the active feedback circuit 931 and the clamp shutdown circuit 932. In certain configurations, the clamp transistor 911 is implemented as a high voltage MOS transistor, such as a DMOS transistor.

The illustrated RC detection circuit 921 includes a detection capacitor 951 and a detection resistor 941 electrically connected in series between the power supply node VDDHV and the ground node VSS. The RC detection circuit 921 generates a detection signal VD, which is provided to the active feedback circuit 931.

The illustrated active feedback circuit 931 includes an active feedback enable transistor 981, a sense resistor 943, a feedback transistor 961, and a first gate protection Zener diode 971. The active feedback enable transistor 981 receives the detection signal VD, which turns on or off the active feedback enable transistor 981 to enable or disable active feedback. A current flows through the sense resistor 943 when the active feedback enable transistor 981 is turned on. The magnitude of the current through the sense resistor 943 and a corresponding gate-to-source voltage of the feedback transistor 961 are based on a magnitude of the voltage difference between the power supply node VDDHV and the ground node VSS. Thus, the active feedback circuit 920 provides a greater amount of feedback when the voltage difference between the power supply node VDDHV and the ground node VSS is large relative to when the voltage difference is small.

As shown in FIG. 12B, the illustrated RC shutdown circuit 922 includes a shutdown resistor 942 and a shutdown capacitor 982 electrically connected in series between the power supply node VDDHV and the ground node VSS. The RC shutdown circuit 922 generates a shutdown signal VS, which is provided to the clamp shutdown circuit 932.

The illustrated clamp shutdown circuit 932 includes a shutdown transistor 952, a pull-down resistor 944, a second gate protection Zener diode 972, and a third gate protection Zener diode 973. The shutdown transistor 952 receives the shutdown signal VS, which when activated controls the shutdown transistor 952 to turn off the clamp transistor 911.

In one embodiment, an RC time constant of the RC shutdown circuit 922 is greater than an RC time constant of the RC detection circuit 921. Implementing the RC time constants in this manner provides reliable shutdown of the clamp transistor 911 during supply power-up.

Figure 12C:
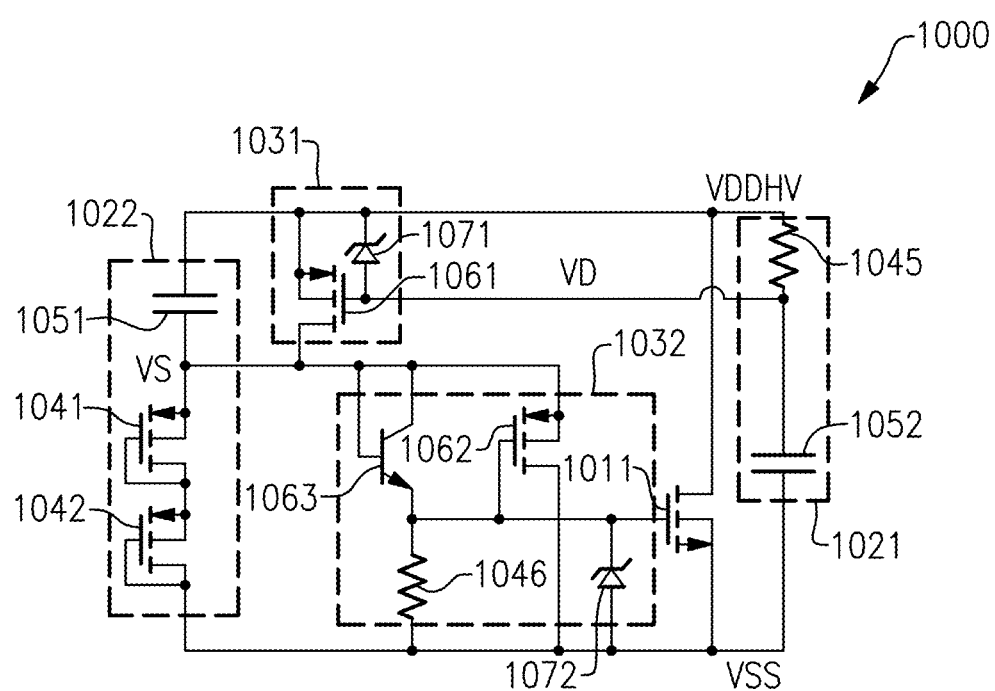
FIG. 12C is a schematic diagram of an actively-controlled high voltage clamp according to another embodiment.

FIG. 12C is a schematic diagram of an actively-controlled high voltage clamp 1000 according to another embodiment. The actively-controlled high voltage clamp 1000 includes a clamp transistor 1011 and a dual RC trigger circuit that includes an RC detection circuit 1021, an RC shutdown circuit 1022, an active feedback circuit 1031, and a clamp shutdown circuit 1032.

The actively-controlled high voltage clamp 1000 of FIG. 12C illustrates another embodiment of the actively-controlled high voltage clamp 900 of FIG. 12A. However, the actively-controlled high voltage clamp 900 of FIG. 12A can be implemented in other ways, including, for example, configurations using more or fewer components and/or a different arrangement of components.

In the illustrated embodiment, the clamp transistor 1011 is implemented as an NMOS transistor, and includes a source electrically connected to the ground node VSS, a drain electrically connected to the power supply node VDDHV, a body electrically connected to the ground node VSS, and a gate that is controlled by both the active feedback circuit 1031 and the clamp shutdown circuit 1032. In certain configurations, the clamp transistor is implemented as a high voltage MOS transistor, such as a DMOS transistor.

The illustrated RC detection circuit 1021 includes a detection resistor 1045 and a detection capacitor 1052 electrically connected in series between the power supply node VDDHV and the ground node VSS. The RC detection circuit 1021 generates a detection signal VD, which is provided to the active feedback circuit 1031.

The illustrated active feedback circuit 1031 includes a feedback transistor 1061 and a first gate protection Zener diode 1071. The feedback transistor 1061 receives the detection signal VD, and the amount of feedback provided by the feedback transistor 1061 changes based on overvoltage conditions between the power supply node VDDHV and the ground node VSS.

As shown in FIG. 12C, the illustrated RC shutdown circuit 1022 includes a shutdown capacitor 1051, a first MOS shutdown resistor 1041, and a second MOS shutdown resistor 1042 electrically connected in series between the power supply node VDDHV and the ground node VSS. The RC shutdown circuit 1022 generates a shutdown signal VS, which is provided to the clamp shutdown circuit 1032. As shown in FIG. 12C, in certain implementations, an RC network can be implemented using one or more transistors implemented to provide a desired resistance of the RC network. Thus, in certain implementations, passive components, such as resistors and/or capacitors, can be implemented using active components, such as transistors, connected to operate passively.

The illustrated clamp shutdown circuit 1032 includes a shutdown MOS transistor 1062, a diode-connected bipolar transistor 1063, a resistor 1046, and a second gate protection Zener diode 1072. The source of the shutdown MOS transistor 1062 and the base and collector of the shutdown bipolar transistor 1063 receives the shutdown signal VS, which is used to control turn off of the clamp transistor 1011. The active feedback circuit 1031 generates a feedback current that flows in part through the shutdown bipolar transistor 1063 and the resistor 1046, thereby controlling the gate voltage of the clamp transistor 1011 to provide feedback.

Figure 13A:
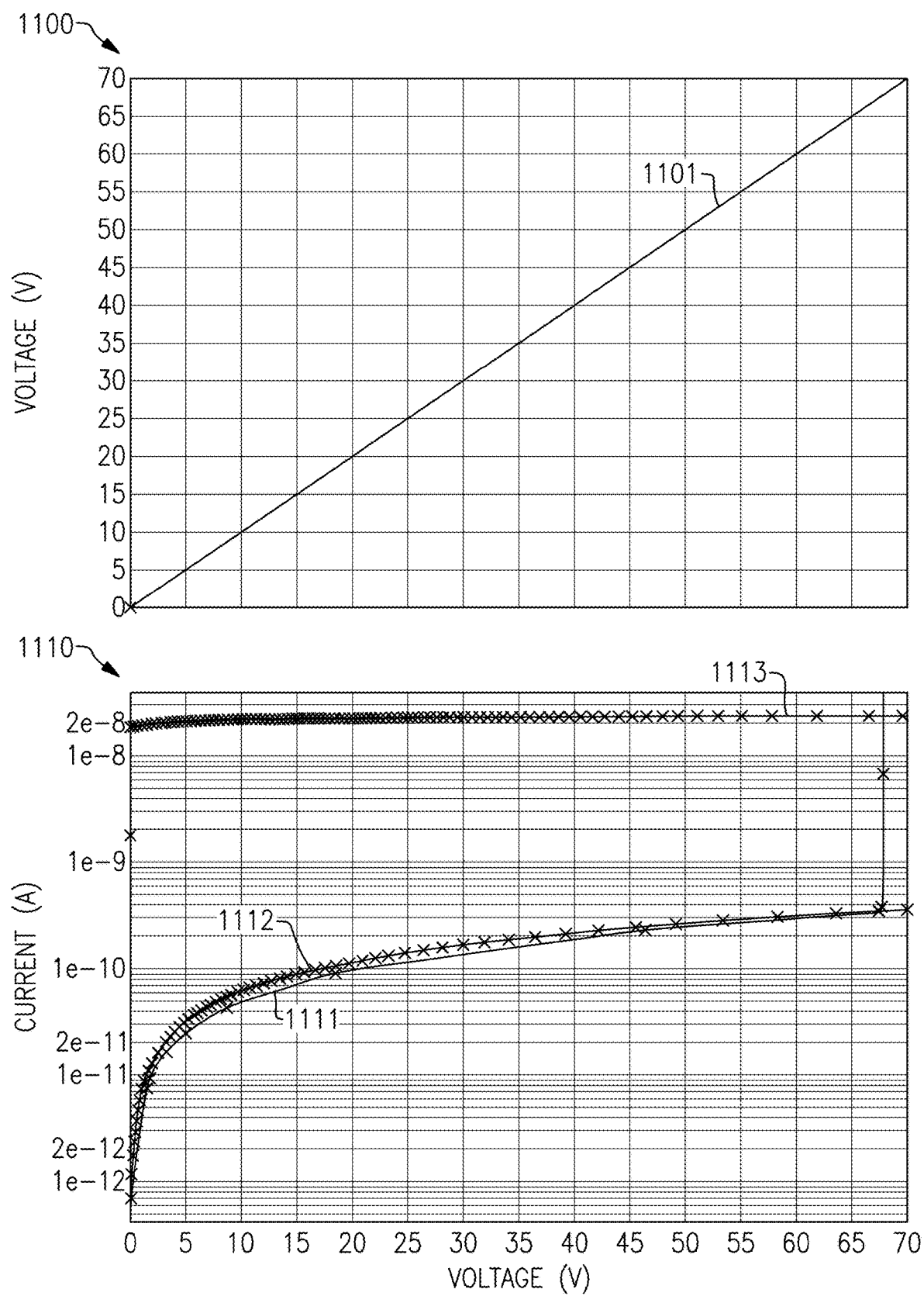
FIG. 13A illustrates one example of current and voltage graphs for an actively-controlled high voltage clamp.

FIG. 13A illustrates one example of current 1110 and voltage 1100 graphs for an actively-controlled high voltage clamp. The first and second graphs 1100 and 1110 correspond to simulations for one implementation of the actively-controlled high voltage clamp of FIG. 13B.

The first graph 1100 includes a plot 1101 of the linear DC voltage sweep of a power supply node VDDHV versus ground node VSS.

The second graph 1110 includes a first plot 1111 of clamp voltage versus clamp current at −40° C., a second plot 1112 of clamp voltage versus clamp current at 25° C., and a third plot 1113 of clamp voltage versus clamp current at 125° C.

Figure 13B:
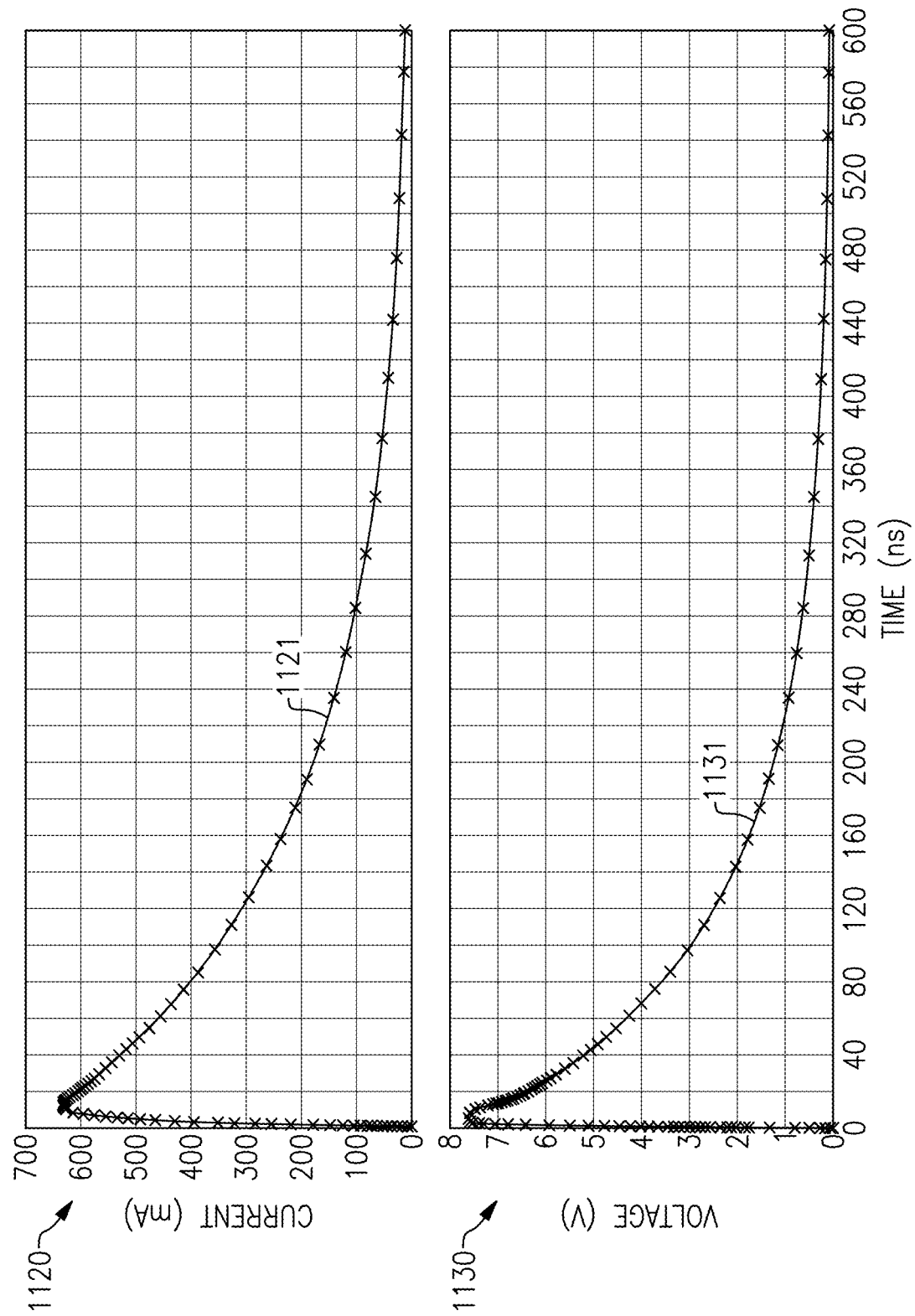
FIG. 13B illustrates another example of graphs of voltage and current versus time for an actively-controlled high voltage clamp.

FIG. 13B illustrates another example of graphs of voltage and current versus time for an actively-controlled high voltage clamp during a 1,000 V HBM stress condition. The first graph 1120 includes a plot 1121 of clamp current versus time in response to a transient overstress event starting at 0 ns. Additionally, the second graph 1130 includes a plot 1131 of clamp voltage versus time in response to a transient overstress event starting at 0 ns.

Although FIGS. 13A-13B illustrates one example of simulation results for an actively-controlled high voltage clamp, other simulation results are possible, including results that depend on implementation, application, and/or processing technology.

Applications

Devices employing the above described schemes can be implemented into various electronic devices. Examples of the electronic devices can include, but are not limited to, consumer electronic products, parts of the consumer electronic products, electronic test equipment, communication infrastructure applications, etc. Further, the electronic device can include unfinished products, including those for communication, industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An integrated circuit with actively-controlled overstress protection, the integrated circuit comprising:
    a clamp electrically connected between a first node and a second node, wherein the clamp incudes a control input that controls activation of the clamp;
    a detection circuit configured to activate a detection signal in response to detecting a transient overstress event between the first node and the second node;

an active feedback circuit configured to turn on the clamp by providing feedback from the first node to the control input of the clamp in response to activation of the detection signal;

a filter configured to detect a passage of the transient overstress event based on filtering a voltage difference between the first node and the second node, wherein the filter is further configured to activate a shutdown signal in response to detecting the passage of the transient overstress event; and a shutdown circuit configured to turn off the clamp via the control input in response to activation of the shutdown signal, wherein the shutdown circuit further includes a bipolar transistor having a base controlled by the shutdown signal, and an emitter connected to the control input of the clamp.

2. The integrated circuit of claim 1, wherein the detection circuit includes a first resistor-capacitor (RC) circuit configured to provide the detection signal at a first output, and the filter includes a second RC circuit configured to provide the shutdown signal at a second output.

3. The integrated circuit of claim 2, wherein a first resistor of the first RC circuit is connected between the first node and the first output, and a first capacitor of the first RC circuit is connected between the second node and the first output, and wherein a second capacitor of the second RC circuit is connected between the first node and the second output, and a second resistor of the second RC circuit is connected between the second node and the second output.

4. The integrated circuit of claim 1, wherein the active feedback circuit includes a field-effect transistor (FET) having a gate controlled by the detection signal, a source connected to the first node, and a drain configured to control the control input of the clamp.

5. The integrated circuit of claim 1, wherein the bipolar transistor further has a collector controlled by the shutdown signal.

6. The integrated circuit of claim 1, wherein the shutdown circuit further includes a resistor connected between the emitter of the bipolar transistor and the second node.

7. The integrated circuit of claim 1, wherein the shutdown circuit further includes a FET having a source controlled by the shutdown signal, a gate connected to the emitter of the bipolar transistor, and a drain connected to the second node.

8. The integrated circuit of claim 1, wherein the shutdown circuit further includes a Zener diode having an anode connected to the second node and a cathode connected to the emitter of the bipolar transistor.

9. The integrated circuit of claim 1, wherein the clamp includes a DMOS transistor having a gate corresponding to the control input.

10. A method of actively-controlled overstress protection on an integrated circuit, the method comprising:

activating a detection signal in response to detecting a transient overstress event between a first node and a second node;

turning on a clamp by providing feedback from the first node to a control input of the clamp in response to activating the detection signal, wherein the clamp is connected between the first node and the second node;

activating a shutdown signal in response to detecting a passage of the transient overstress event, wherein detecting the passage of the transient overstress event includes filtering a voltage difference between the first node and the second node;

controlling a base of a bipolar transistor with the shutdown signal; and turning off the clamp via the control input in response to activation of the shutdown signal, the bipolar transistor having an emitter connected to the control input of the clamp.

11. The method of claim 10, further comprising activating the detection signal using a first resistor-capacitor (RC) circuit, and activating the shutdown signal using a second RC circuit.

12. The method of claim 10, wherein providing feedback from the first node to the control input of the clamp includes turning on a field-effect transistor (FET) in response to the detection signal, and providing a current from the first node to the control input of the clamp through the FET.

13. A clamp control circuit for an integrated circuit, the clamp control circuit comprising:

a detection circuit configured to activate a detection signal in response to detecting a transient overstress event between a first node and a second node;

an active feedback circuit configured to provide feedback from the first node to a control input of a clamp in response to activation of the detection signal;

a filter configured to detect a passage of the transient overstress event based on filtering a voltage difference between the first node and the second node, wherein the filter is further configured to activate a shutdown signal in response to detecting the passage of the transient overstress event; and a shutdown circuit configured to turn off the clamp via the control input in response to activation of the shutdown signal, wherein the shutdown circuit further includes a bipolar transistor having a base controlled by the shutdown signal, and an emitter connected to the control input of the clamp.

14. The clamp control circuit of claim 13, wherein the detection circuit includes a first resistor-capacitor (RC) circuit configured to provide the detection signal at a first output, and the filter includes a second RC circuit configured to provide the shutdown signal at a second output.

15. The clamp control circuit of claim 13, wherein the active feedback circuit includes a field-effect transistor (FET) having a gate controlled by the detection signal, a source connected to the first node, and a drain configured to control the control input of the clamp.

16. The clamp control circuit of claim 13, wherein the bipolar transistor further has a collector controlled by the shutdown signal.

17. The clamp control circuit of claim 13, wherein the shutdown circuit further includes a resistor connected between the emitter of the bipolar transistor and the second node.

18. The clamp control circuit of claim 13, wherein the shutdown circuit further includes a FET having a source controlled by the shutdown signal, a gate connected to the emitter of the bipolar transistor, and a drain connected to the second node.

19. The clamp control circuit of claim 13, wherein the shutdown circuit further includes a Zener diode having an anode connected to the second node and a cathode connected to the emitter of the bipolar transistor.

20. The method of claim 10, further comprising controlling the collector of the bipolar transistor with the shutdown signal.

* * * * *